(12) United States Patent
Moon

(10) Patent No.: US 11,610,949 B2
(45) Date of Patent: Mar. 21, 2023

(54) ORGANIC ELECTROLUMINESCENCE DISPLAY PANEL, METHOD FOR MANUFACTURING THE SAME, AND DISPLAY APPARATUS

(71) Applicant: YUNGU (GU'AN) TECHNOLOGY CO., LTD., Langfang (CN)

(72) Inventor: Kookchul Moon, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 106 days.

(21) Appl. No.: 16/987,429

(22) Filed: Aug. 7, 2020

(65) Prior Publication Data
US 2020/0365671 A1 Nov. 19, 2020

Related U.S. Application Data

(63) Continuation of application No. PCT/CN2019/089105, filed on May 29, 2019.

(30) Foreign Application Priority Data

Nov. 19, 2018 (CN) .......................... 201811376106.6

(51) Int. Cl.
*H01L 51/56* (2006.01)
*H01L 27/32* (2006.01)
*H01L 51/52* (2006.01)

(52) U.S. Cl.
CPC ...... *H01L 27/3246* (2013.01); *H01L 51/5215* (2013.01); *H01L 51/56* (2013.01); *H01L 2227/323* (2013.01); *H01L 2251/305* (2013.01)

(58) Field of Classification Search
CPC .................................................. H01L 29/7869
See application file for complete search history.

(56) References Cited

U.S. PATENT DOCUMENTS 9,147,772 B2  9/2015  Im
10,297,622 B2  5/2019  Na et al.
(Continued)

FOREIGN PATENT DOCUMENTS

CN  103000632 A  3/2013
CN  106876334 A  6/2017
(Continued)

OTHER PUBLICATIONS

International Search Report of International Application No. PCT/CN2019/089105.
Office Action of Chinese Patent Application No. 201811376106.6.

*Primary Examiner* — Fernando L Toledo
*Assistant Examiner* — Valerie N Newton
(74) *Attorney, Agent, or Firm* — Kilpatrick Townsend & Stockton, LLP

(57) ABSTRACT

The present disclosure discloses an organic electroluminescence display panel, a method for manufacturing the display panel, and a display apparatus. The organic electroluminescence display panel includes: a substrate including a first region and a second region adjacent to each other; a buffer layer located on the substrate; a first active layer located on the buffer layer in the first region; a first gate located on the first active layer and insulated from the first active layer; a second active layer located on the buffer layer in the second region; a metal electrode located on the first gate and insulated from the first gate; and a second gate located on the second active layer and insulated from the second active layer.

19 Claims, 34 Drawing Sheets

(56) References Cited

U.S. PATENT DOCUMENTS

| | | |
|---|---|---|
| 2004/0229408 A1 | 11/2004 | Chang |
| 2015/0053953 A1 | 2/2015 | Ebisuno et al. |
| 2018/0261632 A1 | 9/2018 | Choi |
| 2018/0366586 A1* | 12/2018 | Son .................... H01L 29/7869 |
| 2019/0027511 A1 | 1/2019 | Li et al. |
| 2021/0280615 A1* | 9/2021 | Yang ................ H01L 29/66969 |

FOREIGN PATENT DOCUMENTS

| | | |
|---|---|---|
| CN | 107275350 A | 10/2017 |
| CN | 107819005 A | 3/2018 |
| CN | 108493198 A | 9/2018 |
| CN | 109509775 A | 3/2019 |

\* cited by examiner

ORGANIC ELECTROLUMINESCENCE DISPLAY PANEL, METHOD FOR MANUFACTURING THE SAME, AND DISPLAY APPARATUS

CROSS-REFERENCE OF RELATED APPLICATIONS

This application is a continuation of International Application No. PCT/CN2019/089105, filed on May 29, 2019, which claims priority to Chinese Patent Application No. 201811376106.6, filed on Nov. 19, 2018, both of which are hereby incorporated by reference in their entireties.

TECHNICAL FIELD

The present disclosure relates to the field of display technologies.

BACKGROUND

Pixel circuits of current organic electroluminescence display panels are mostly consisted of low temperature poly-silicon thin-film transistors (LTPS-TFT). LTPS-TFTs have a serious current leakage problem despite their good stability, while Oxide-TFTs have low electron mobility. Therefore, a low temperature poly-silicon thin-film oxide (LTPO) technology combining LTPS-TFT with Oxide-TFT can be adopted to manufacture a TFT with high performance.

SUMMARY

According to exemplary embodiments of the present disclosure, an organic electroluminescence display panel, a method for manufacturing the display panel, and a display apparatus having the display panel are provided.

An organic electroluminescence display panel includes: a substrate having a first region and a second region adjacent to the first region; a buffer layer located on the substrate; a patterned first active layer located on the buffer layer and corresponding to the first region; a patterned first gate located on the first active layer and insulated from the first active layer; a patterned second active layer located on the buffer layer and corresponding to the second region; a patterned metal electrode located on the first gate and insulated from the first gate; and a patterned second gate located on the second active layer and insulated from the second active layer.

In an embodiment, the organic electroluminescence display panel further includes: a first gate insulating layer located between the first active layer and the first gate; a first interlayer insulating layer located on the first gate; a second gate insulating layer located on the first interlayer insulating layer corresponding to the first region and corresponding to the first gate; and a third gate insulating layer located between the second active layer and the second gate.

In an embodiment, the organic electroluminescence display panel further includes: a second interlayer insulating layer located on the metal electrode and the second gate; two first vias located in positions corresponding to both ends of the first active layer, penetrating at least the first gate insulating layer, and respectively exposing the both ends of the first active layer; two second vias located in positions corresponding to both ends of the second active layer, and respectively exposing the both ends of the second active layer; a first source and drain located at the both ends of the first active layer; a second source and drain located at the both ends of the second active layer; and a first planarization layer located on the second interlayer insulating layer, the first planarization layer being provided with a third via, the third via exposing the source of the first active layer or the drain of the second active layer, or exposing the drain of the first active layer or the source of the second active layer.

In an embodiment, the organic electroluminescence display panel further includes: a transparent conductive layer located on the first planarization layer to form an anode; a pixel defining layer located on the transparent conductive layer and the first planarization layer; and a support pillar located on the pixel defining layer.

In an embodiment, the substrate further includes a third region adjacent to the second region, the display panel further includes: a PI layer located between the substrate and the buffer layer; and a second planarization layer deposited on a surface of the PI layer corresponding to the third region, and penetrating the second interlayer insulating layer to the buffer layer.

In an embodiment, the first active layer is made of low temperature polysilicon.

In an embodiment, the second active layer is made of metal oxide.

A display apparatus includes the above-mentioned organic electroluminescence display panel.

A method for manufacturing an organic electroluminescence display panel includes: forming a buffer layer on a substrate, the substrate including a first region and a second region adjacent to each other; forming a patterned first active layer on the buffer layer corresponding to the first region; forming a patterned first gate on the first active layer, the first gate being insulated from the first active layer; forming a patterned second active layer on the buffer layer corresponding to the second region; forming a patterned metal electrode on the first gate, the metal electrode being insulated from the first gate; and forming a patterned second gate on the second active layer, the second gate being insulated from the second active layer.

In an embodiment, the forming a patterned first gate on the first active layer includes: forming a first gate insulating layer on the first active layer; forming a first metal film layer on the first gate insulating layer; and patterning the first metal film layer to obtain the first gate.

In an embodiment, the forming a patterned second active layer on the second region includes: forming a first interlayer insulating layer on the first gate insulating layer and the first gate; and forming a metal oxide layer on the first interlayer insulating layer to the second region, and patterning the metal oxide layer to obtain the second active layer.

In an embodiment, the forming a patterned metal electrode on the first gate, and forming a patterned second gate on the second active layer includes: forming a silicon oxide film layer on the first interlayer insulating layer and the second active layer; forming a second metal film layer on the silicon oxide film layer; and patterning the second metal film layer and the silicon oxide film layer to respectively obtain a second gate insulating layer located in the first region and the metal electrode located on the second gate insulating layer, a third gate insulating layer located on the second region, and the second gate located on the third gate insulating layer.

In an embodiment, the method further includes: forming a second interlayer insulating layer on the first interlayer insulating layer, the metal electrode, and the second gate; forming two first vias penetrating at least the second interlayer insulating layer corresponding to both ends of the first active layer to respectively expose the both ends of the first active layer; and forming two second vias penetrating at least the second interlayer insulating layer corresponding to both ends of the second active layer to respectively expose the both ends of the second active layer.

In an embodiment, the method further includes: depositing a third metal film layer in the two first vias and the two second vias, and on the second interlayer insulating layer, patterning the third metal film layer to form a first source and drain at the both ends of the first active layer, and form a second source and drain at the both ends of the second active layer; and forming a first planarization layer on the first interlayer insulating layer, the first source and drain, and the second source and drain, and providing a third via on the first planarization layer to expose the source of the first active layer or the drain of the second active layer, or expose the drain of the first active layer or the source of the second active layer.

In an embodiment, the method further includes: forming a transparent conductive layer on the first planarization layer, and patterning the transparent conductive layer to form an anode; forming a pixel defining layer on the transparent conductive layer and the first planarization layer; and forming a support pillar on the pixel defining layer.

In an embodiment, the substrate further includes a third region adjacent to the second region, and prior to forming a buffer layer on a substrate, the method further includes forming a PI layer on the substrate; after the steps of forming a second interlayer insulating layer on the first interlayer insulating layer, the metal electrode, and the second gate, forming two first vias in the second interlayer insulating layer corresponding to both ends of the first active layer, and forming two second vias in the second interlayer insulating layer corresponding to both ends of the second active layer, the method further includes: etching the film layers from the second interlayer insulating layer to the buffer layer corresponding to the third region to expose the PI layer; and depositing a second planarization layer on an exposed surface of the PI layer.

In an embodiment, the second planarization layer is made of a flexible material.

In an embodiment, the first active layer is made of low temperature polysilicon.

In an embodiment, the second active layer is made of metal oxide.

In an embodiment, the first region is a region for manufacturing a LTPS-TFT, the second region is a region for manufacturing an Oxide-TFT, and the third region is configured to manufacture a bendable region.

Be means of the above-mentioned technical solutions, the LTPS-TFT in the top gate configuration and the Oxide-TFT in the top gate configuration are respectively manufactured. The fact that the first active layer is located below the first gate, and the second active layer is located below the second gate, facilitates the simplification of the subsequent manufacturing processes of the sources and drains, that is, the sources and drains of the LTPS-TFT and the Oxide-TFT are manufactured by means of the same one lithography process, thereby reducing the lithography processes and simplifying the complexity of processes.

DETAILED DESCRIPTION OF THE EMBODIMENTS

In order to make the objects, features and advantages of the present disclosure more apparent and clearer for understanding, the embodiments of the present disclosure will be illustrated in detail below with reference to the drawings.

As described above, the process for manufacturing a current LTPO-TFT requires at least eleven masking processes, and in term of a flexible panel, thirteen masking processes are required. The more the times of masking processes, the more complex the manufacturing process is.

Figure 1:
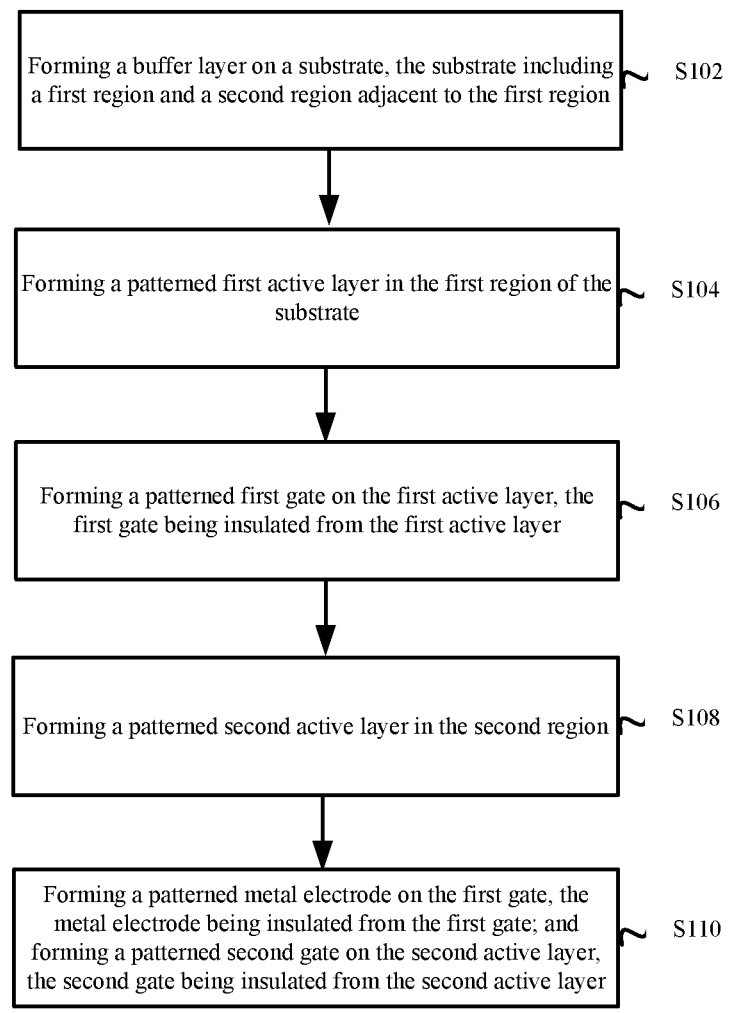
FIG. 1 shows a flowchart of a method for manufacturing an organic electroluminescence display panel according to an embodiment of the present disclosure.

FIG. 1 shows a flowchart of a method for manufacturing an organic electroluminescence display panel according to an embodiment of the present disclosure. Taking into account the requirement for arranging a plurality of LTPO-TFTs in array on the same substrate, a buffer layer within a single pixel unit can be divided into different manufacturing regions. For example, a first region is a region for manufacturing a LTPS-TFT, and a second region is a region for manufacturing an Oxide-TFT. In addition, for a flexible display panel, a third region can also be formed for manufacturing a bendable region. It should be noted that the present disclosure is not limited to this manner for the division. The first region can be used as the region for manufacturing the Oxide-TFT, and the second region can be used as the region for manufacturing the LTPS-TFT. The method substantially includes the following steps.

In step S102, a buffer layer is formed on a substrate including a first region and a second region adjacent to the first region.

Specifically, an adhesive is coated on the substrate to form the buffer layer.

Figure 9A:
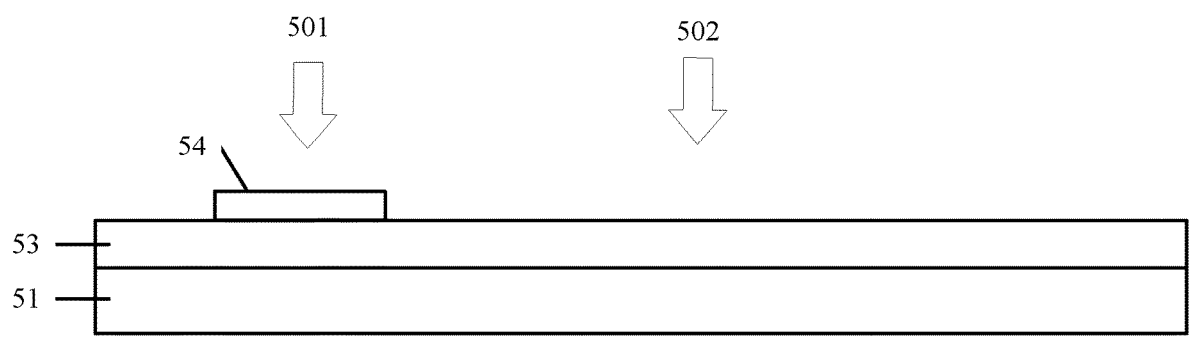
FIGS. 9a to 9j show sectional diagrams in the process of manufacturing a rigid organic electroluminescence display panel according to an embodiment of the present disclosure.

When manufacturing a rigid display panel, referring to FIG. 9a, a surface of a glass substrate 51 is coated with the adhesive to form the buffer layer 53 covering the whole glass substrate 51. The materials of the adhesive and the buffer layer are the same as or similar to the materials used in the prior art. The glass substrate 51 includes the first region 501 and the second region 502 adjacent thereto.

In step S104, a patterned first active layer is formed in the first region of the substrate.

The specific manufacturing process may be as follows: forming an amorphous silicon film layer on the buffer layer, and then, performing a laser annealing process on the amorphous silicon film layer to obtain a polysilicon film layer. Then, the polysilicon film layer is patterned by a masking process to obtain the first active layer located in the first region. During the patterning process, a positive photoresist or a negative photoresist can be selected to be coated on the polysilicon film layer. Then, processes of masking, exposing, developing, etching, and the like can be performed with a suitable mask plate.

During manufacturing of a rigid display panel, referring to FIG. 9a, an amorphous silicon film layer is formed on the buffer layer 53 by a chemical vapor deposition (CVD) process, and then, the amorphous silicon film layer is subjected to high-temperature oxidation treatment by laser annealing to obtain the polysilicon film layer. Next, using a first masking process, the polysilicon film layer is coated with the corresponding photoresist, and masking, exposing, developing, and etching are performed to obtain the first active layer 54 in the first region 501, which is the active layer for the LTPS-TFT.

Figure 10A:
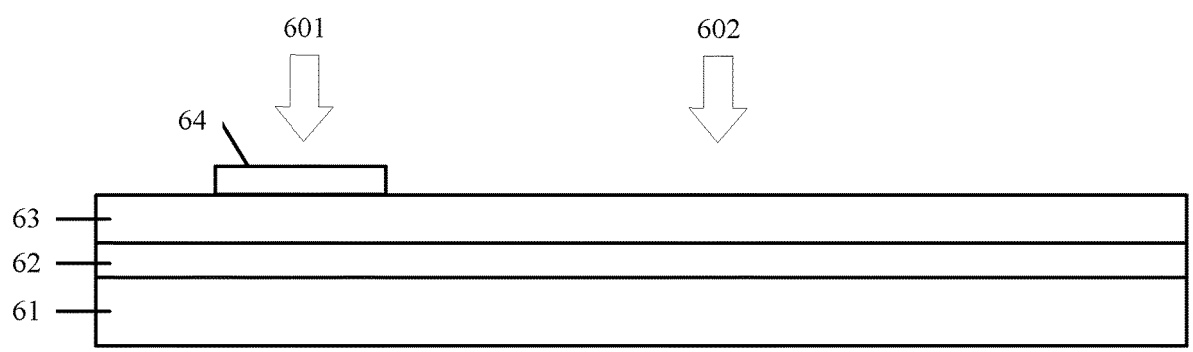
FIGS. 10a to 10l show sectional diagrams in the process for manufacturing a flexible organic electroluminescence display panel according to an embodiment of the present disclosure.

During manufacturing of a flexible display panel, referring to FIG. 10a, a surface of the glass substrate 61 is coated with a polyimide (PI) layer 62, and the buffer layer 63 covering the whole PI layer 62 is formed on the PI layer 62. In the present embodiment, the flexible display panel can include at least one repeating unit, and each repeating unit includes a PI layer and a buffer layer. In the following description, a single repeating unit will be exemplified. Then, the amorphous silicon film layer is formed on the buffer layer 63 using the CVD process, and then, the amorphous silicon film layer is subjected to the high-temperature oxidation treatment by the laser annealing to obtain the polysilicon film layer. Next, using a first masking process, the polysilicon film layer is coated with the corresponding photoresist, and masking, exposing, developing, and etching are performed to obtain the first active layer 64 in the first region 601, which is the active layer for the LTPS-TFT.

In step S106, a patterned first gate is formed on the first active layer 64, and the first gate is insulated from the first active layer 64.

Figure 2:
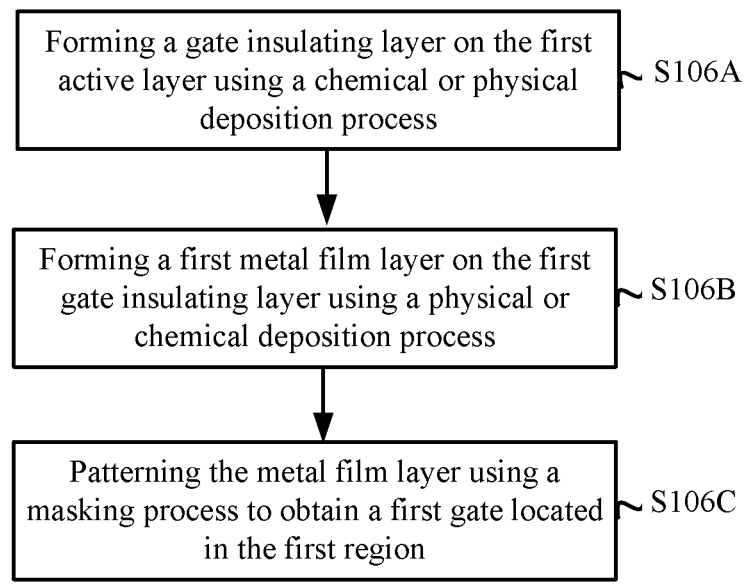
FIG. 2 shows a flowchart of step S106 shown in FIG. 1.

In an embodiment, as shown in FIG. 2, step S106 of forming the patterned first gate on the first active layer 64 specifically includes:

In step S106A, a first gate insulating layer is formed on the first active layer 64 by a chemical or physical deposition process.

In step S106B, a first metal film layer is formed on the first gate insulating layer by a physical or chemical deposition process.

In step S106C, the metal film layer is patterned by a masking process to obtain the first gate in the first region.

Figure 9B:
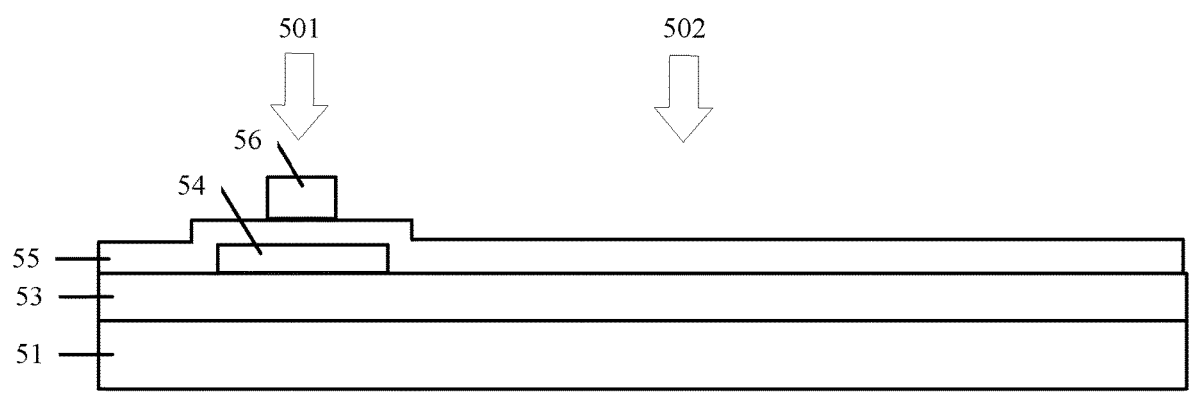

During manufacturing of the rigid display panel, referring to FIG. 9b, after the first active layer 54 is obtained, a silicon dioxide film layer is deposited on the first active layer 54 and the exposed buffer layer 53 using the CVD process again to obtain the first gate insulating layer 55. Then, the first metal film layer is deposited on the surface of the first gate insulating layer 55 using the physical vapor deposition (PVD) process, and the first metal film layer is patterned using a second masking process to obtain the first gate 56 located in the first region 501, that is, the gate of the LTPS-TFT.

Figure 10B:
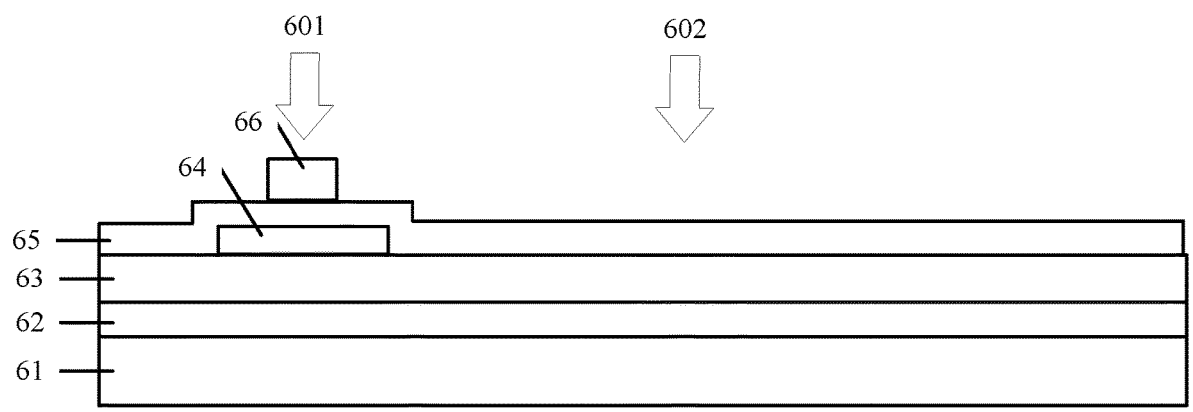

During manufacturing of the flexible display panel, referring to FIG. 10b, after the first active layer 64 is obtained, the silicon dioxide film layer is deposited on the buffer layer 63 on which the first active layer 64 is formed using the CVD process again to obtain the first gate insulating layer 65. Then, the first metal film layer is deposited on the surface of the first gate insulating layer 65 using the PVD process, and the first metal film layer is patterned using the second masking process to obtain the first gate 66 located in the first region 601, that is, the gate of the LTPS-TFT.

Further referring to FIG. 1, in step S108, a patterned second active layer is formed in the second region.

Figure 3:
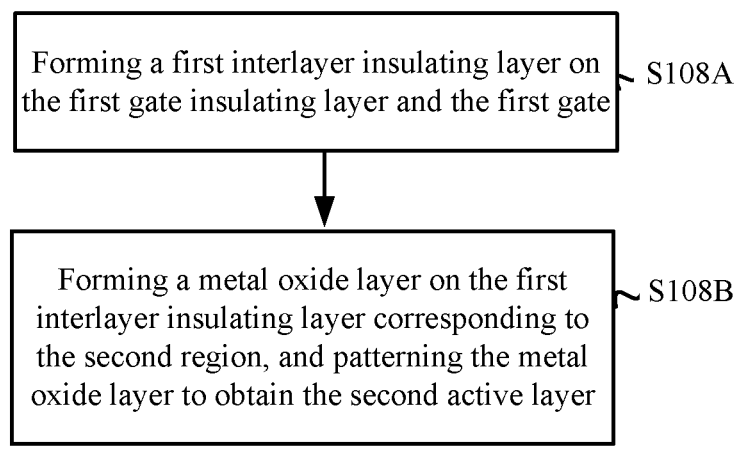
FIG. 3 shows a flowchart of step S108 shown in FIG. 1.

In an embodiment, as shown in FIG. 3, step S108 of forming the patterned second active layer in the second region of the buffer layer further includes:

In step S108A, a first interlayer insulating layer is formed on the first gate insulating layer and the first gate.

In step S108B: a metal oxide layer is formed on the first interlayer insulating layer corresponding to the second region, and the metal oxide layer is patterned to obtain the second active layer.

Figure 9C:
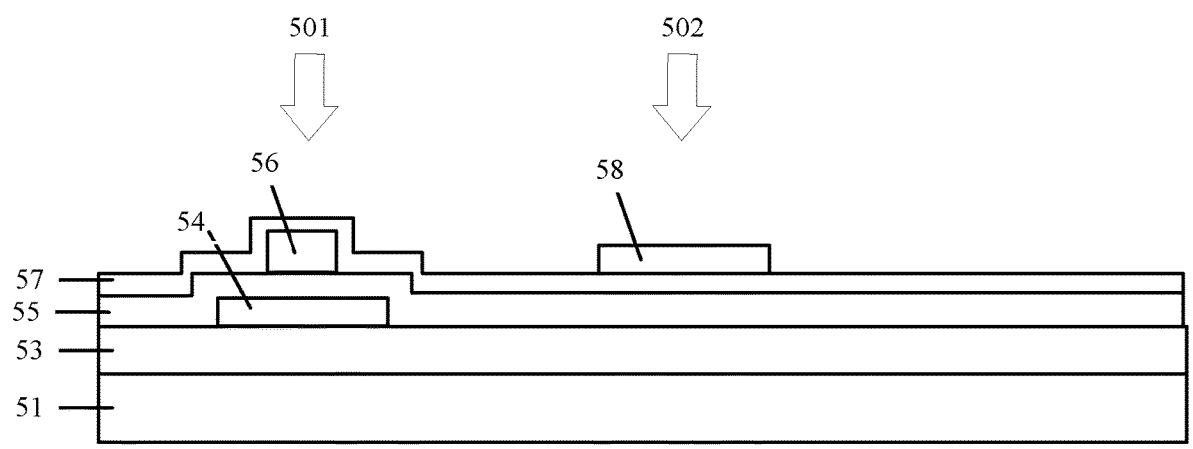

During manufacturing of the rigid display panel, referring to FIG. 9c, a silicon oxide, for example, a silicon dioxide layer, is deposited on the surface of the first gate insulating layer 55 on which the first gate 56 is formed to obtain the first interlayer insulating layer 57, which overlaps the surfaces of the first gate 56 and the exposed first gate insulating layer 55. Then, the metal oxide layer, for example, an indium gallium zinc oxide (IGZO) film layer, is formed on the first interlayer insulating layer 57 corresponding to the second region 502 of the buffer layer 53 using the physical or chemical deposition process, for example, the PVD process. Then, the IGZO film layer is patterned using a third masking process to obtain the second active layer 58, that is, the active layer of the Oxide-TFT.

Figure 10C:
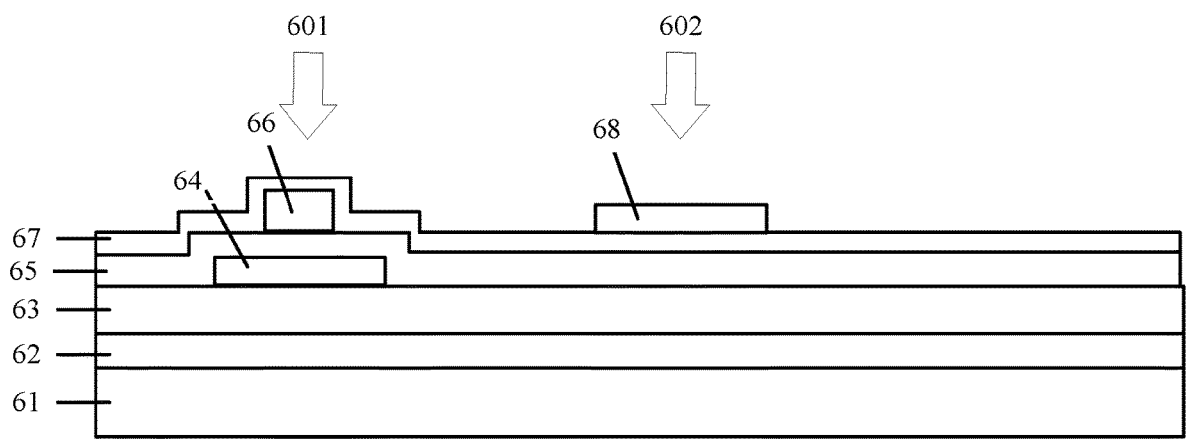

During manufacturing of the rigid display panel, referring to FIG. 10c, a silicon oxide, for example, a silicon dioxide layer, is deposited on the surface of the first gate insulating layer 65 on which the first gate 66 is formed to obtain the first interlayer insulating layer 67, which overlaps the exposed surfaces of the first gate 66 and the first gate insulating layer 65. Then, the metal oxide layer, for example, an IGZO film layer, is formed on the first interlayer insulating layer 67 corresponding to the second region 602 of the buffer layer 63 using the physical or chemical deposition process, for example, the PVD process. Then, the IGZO film layer is patterned using the third masking process to obtain the second active layer 68, that is, the active layer of the Oxide-TFT.

Further referring to FIG. 1, in step S110, a patterned metal electrode is formed on the first gate, and the metal electrode is insulated from the first gate. A patterned second gate is formed on the second active layer, and the second gate is insulated from the second active layer.

Figure 4:
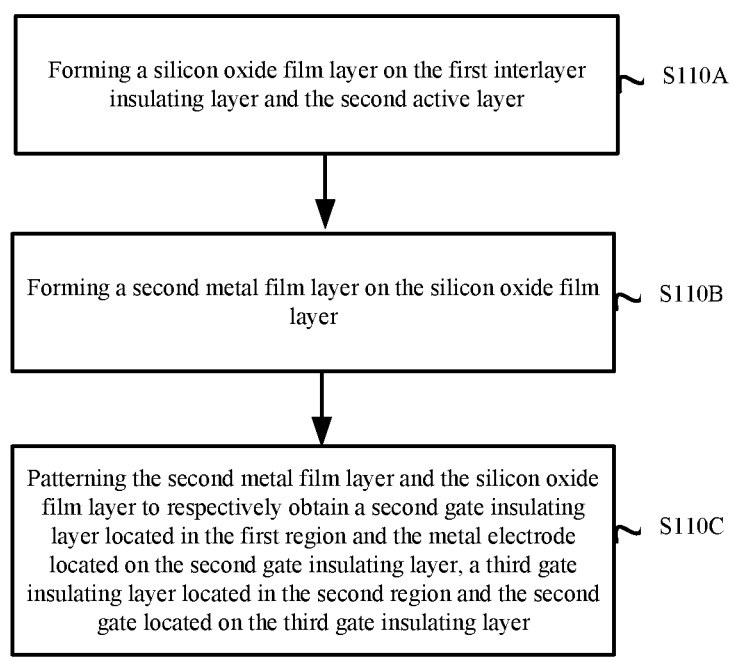
FIG. 4 shows a flowchart of step S110 shown in FIG. 1.

In an embodiment, as shown in FIG. 4, step S110 of forming the patterned metal electrode on the first gate, and forming the patterned second gate on the second active layer further includes:

In step S110A, a silicon oxide film layer is formed on the first interlayer insulating layer.

In step S110B, a second metal film layer is formed on the silicon oxide film layer.

In step S110C, the second metal film layer and the silicon oxide film layer are patterned to respectively obtain a second gate insulating layer located in the first region and the metal electrode located on a second gate insulating layer, a third gate insulating layer located in the second region, and the second gate located on the third gate insulating layer.

Figure 9D:
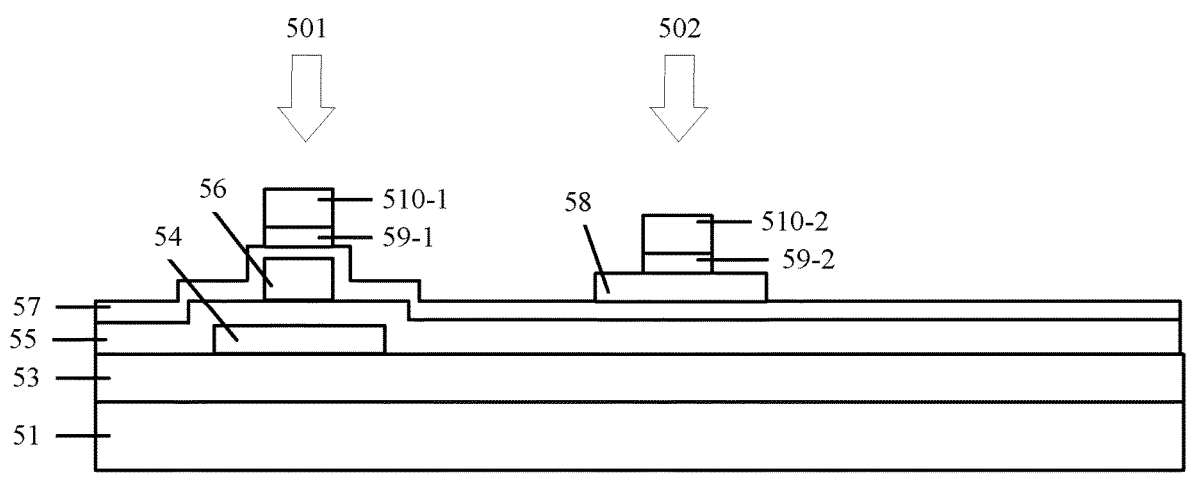

During manufacturing of the rigid display panel, referring to FIG. 9d, after the patterned second active layer 58 is formed, the silicon oxide film layer, for example, a silicon dioxide film layer, is firstly deposited on the first interlayer insulating layer 57 using the CVD process. Then, the second metal film layer is deposited on the silicon dioxide film layer using the physical or chemical deposition process, for example, the PVD process, and the silicon dioxide film layer and the second metal film layer are simultaneously patterned using a fourth masking process. That is, a single photolithography process is used to obtain the second gate insulating layer 59-1 and the metal electrode 510-1 located in the first region 501 and obtain the third gate insulating layer 59-2 and the second gate 510-2 (which is the gate of the Oxide-TFT), located in the second region 502. The metal electrode 510-1 and the first gate 56 are insulated from each other by the second gate insulating layer 59-1 and the first interlayer insulating layer 57 sandwiched therebetween, and the metal electrode 510-1 and the first gate 56 can form a storage capacitor. The second gate 510-2 and the second active layer 58 are insulated from each other by the third gate insulating layer 59-2.

Figure 10D:
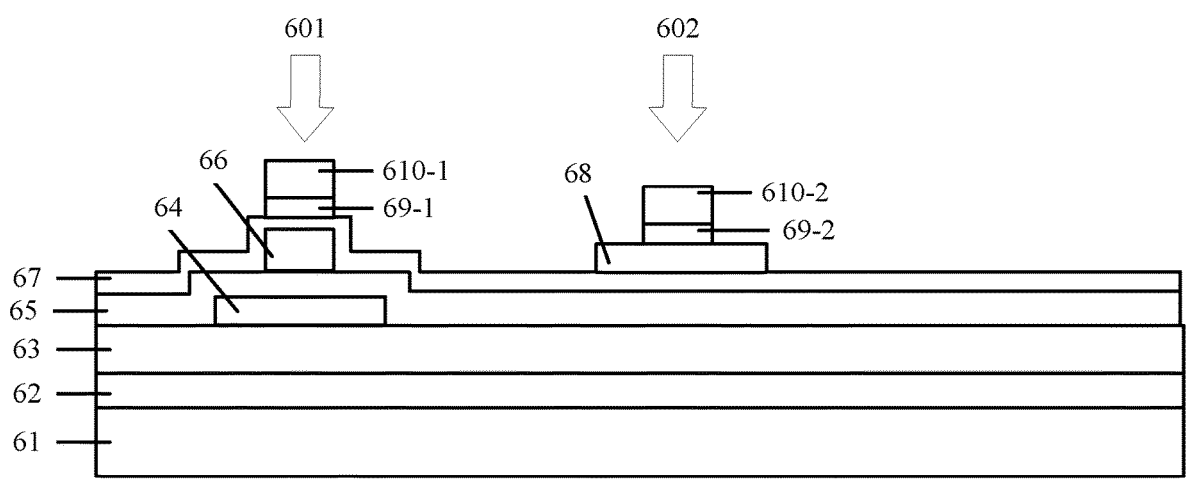

During manufacturing of the flexible display panel, referring to FIG. 10d, after the patterned second active layer 68 is formed, the silicon oxide film layer, for example, the silicon dioxide film layer, is firstly deposited on the first interlayer insulating layer 67 and the second active layer 68 using the CVD process. Then, the second metal film layer is deposited on the silicon dioxide film layer using the physical or chemical deposition process, for example, the PVD process, and the silicon dioxide film layer and the second metal film layer are patterned using the fourth masking process. That is, a single photolithography process is used to obtain the second gate insulating layer 69-1 and the metal electrode 610-1 located in the first region 601 and obtain the third gate insulating layer 69-2 and the second gate 610-2 (which is the gate of the Oxide-TFT), located in the second region 602. The metal electrode 610-1 and the first gate 66 are insulated from each other by the second gate insulating layer 69-1 and the first interlayer insulating layer 67 sandwiched therebetween, and the metal electrode 610-1 and the first gate 66 can form the storage capacitor. The second gate 610-2 and the second active layer 68 are insulated from each other by the third gate insulating layer 69-2.

In the method for manufacturing the organic electroluminescence display panel, due to the top gate configuration, the active layers of the LTPS-TFT and the Oxide-TFT are located below the gates, so that vias for the sources and drains can be formed using the same masking process in subsequent processes. As such, compared with the conventional masking process, the times of masking can be reduced, and the processes can be simplified.

Figure 5:
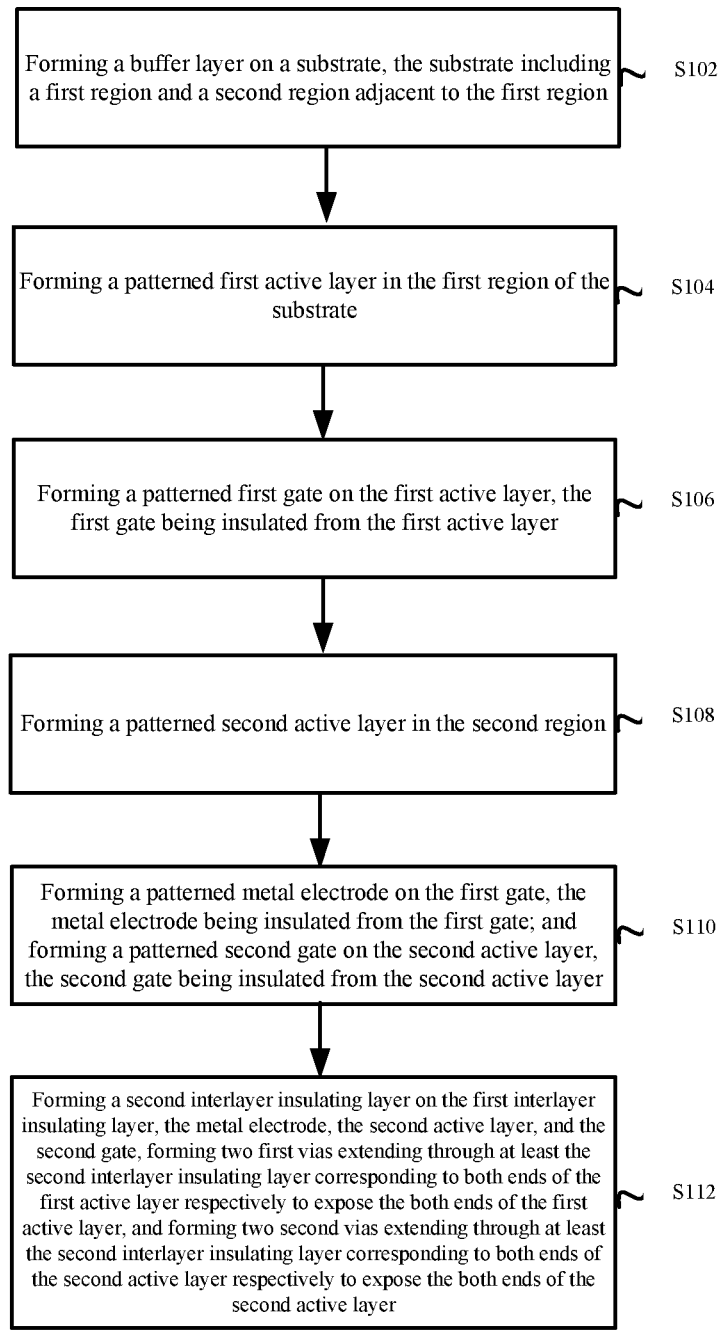
FIG. 5 shows a flowchart of the method for manufacturing an organic electroluminescence display panel according to another embodiment of the present disclosure.

In an embodiment, as shown in FIG. 5, the method further includes:

In step S112, a second interlayer insulating layer is formed on the first interlayer insulating layer, the metal electrode, and the second gate, and two first vias penetrating at least the second interlayer insulating layer corresponding to both ends of the first active layer are formed to respectively expose the both ends of the first active layer; and two second vias penetrating at least the second interlayer insulating layer corresponding to both ends of the second active layer are formed to respectively expose the both ends of the second active layer.

After the patterned second gate is formed, the second interlayer insulating layer is formed, and a third via is manufactured to respectively form the sources and drains of the LTPS-TFT and the Oxide-TFT.

The first active layer is made of low temperature polysilicon (also known as P—Si). The second active layer is made of metal oxide, especially IGZO. Furthermore, the metal oxide can also be made of other materials suitable for an active layer, which will not be limited hereto.

It should be understood that, the involved interlayer insulating layer in the present disclosure can be an interlayer insulating layer or a gate insulating layer formed subsequently, which can be configured according to a specific structure of the organic electroluminescence display panel.

Figure 9E:
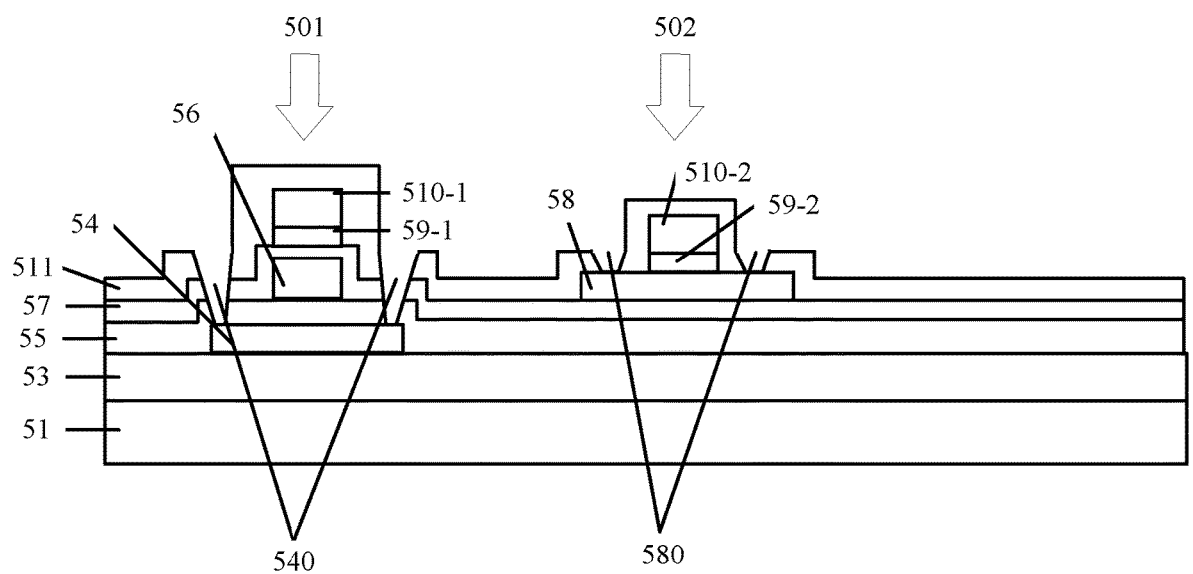

During manufacturing of the rigid display panel, referring to FIG. 9e, a silicon dioxide film layer is firstly deposited on the first interlayer insulating layer 57, the metal electrode 510-1, and the second gate 510-2 to form the second interlayer insulating layer 511. Then, two first vias 540 and two second vias 580 are respectively formed using a fifth masking process, in the first region 501 corresponding to the both ends of the first active layer 54, and in the second interlayer insulating layer 511 in the second region 502 corresponding to the both ends of the second active layer 58. The two first vias 540 respectively expose the both ends of the first active layer 54, and the two second vias 580 respectively expose the both ends of the second active layer 58.

Figure 10E:
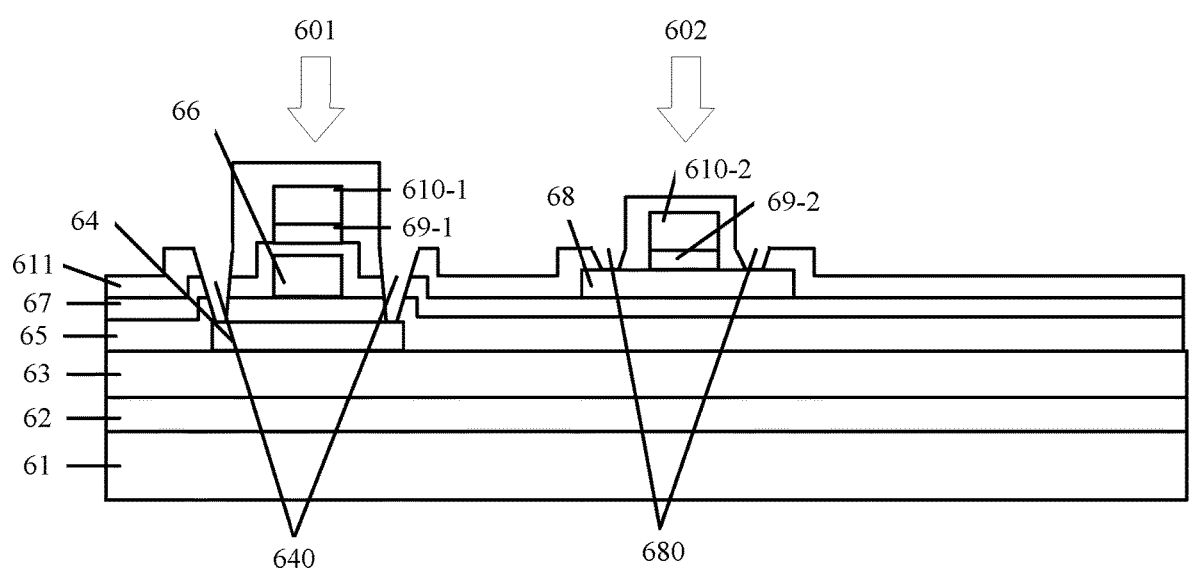

During manufacturing of the flexible display panel, referring to FIG. 10e, a silicon dioxide film layer is firstly deposited on the first interlayer insulating layer 67, the metal electrode 610-1, and the second gate 610-2 to form the second interlayer insulating layer 611. Then, the two first vias 640 and the two second vias 680 are respectively formed, using the fifth masking process, in the first region 601 corresponding to the both ends of the first active layer 64, and in the second interlayer insulating layer 611 in the second region 602 corresponding to the both ends of the second active layer 68. The two first vias 640 respectively expose the both ends of the first active layer 64, and the two second vias 680 respectively expose the both ends of the second active layer 68.

Figure 6:
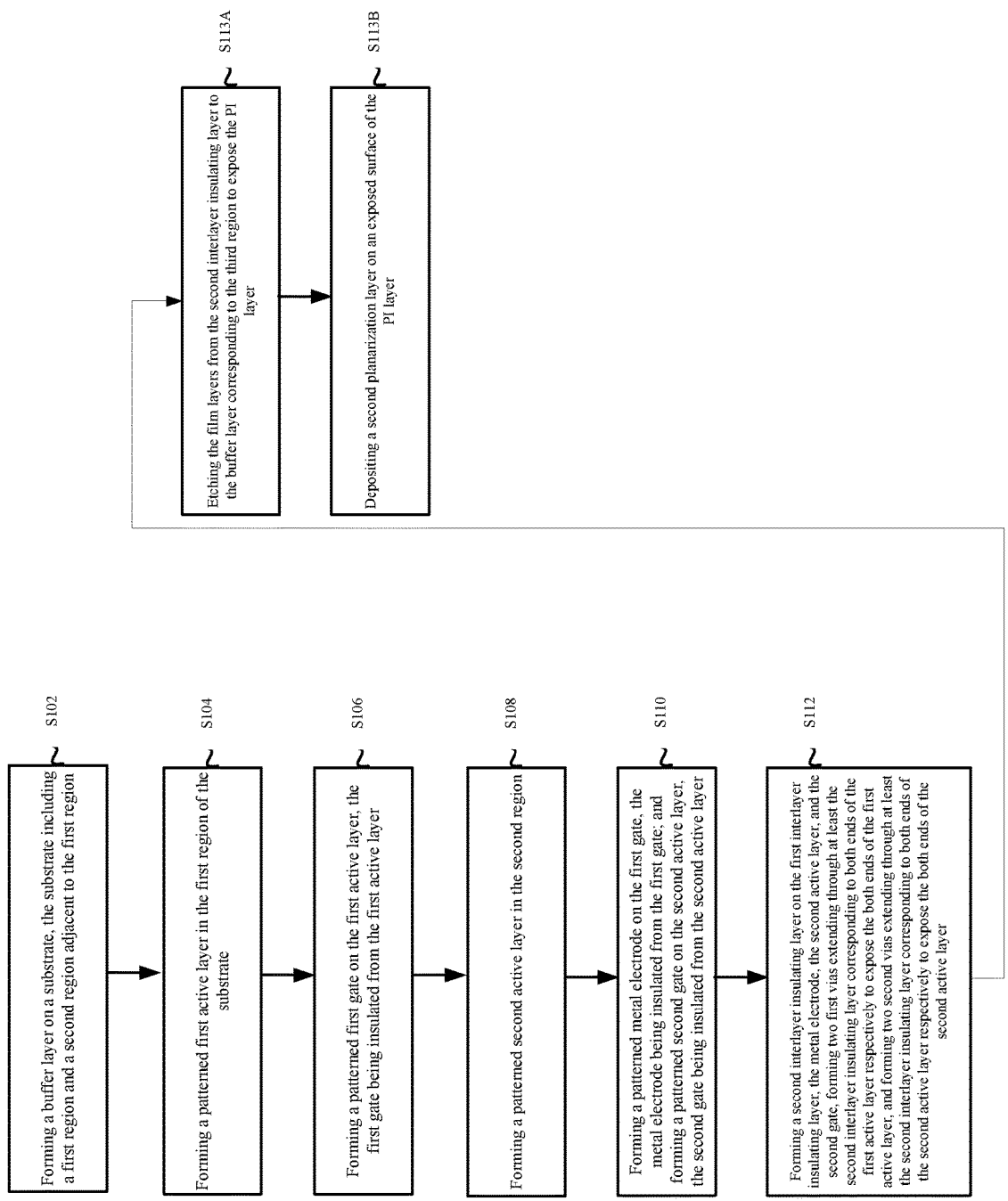
FIG. 6 shows a flowchart of the method for manufacturing an organic electroluminescence display panel according to yet another embodiment of the present disclosure.

As shown in FIG. 6, after step S112, during manufacturing of the flexible display panel, the substrate formed in step S102 further includes a third region adjacent to the second region. A PI layer is further provided between the substrate and the buffer layer. The method further includes following steps.

In step S113A, the film layers from the second interlayer insulating layer to the buffer layer corresponding to the third region are etched to expose the PI layer.

Figure 10F:
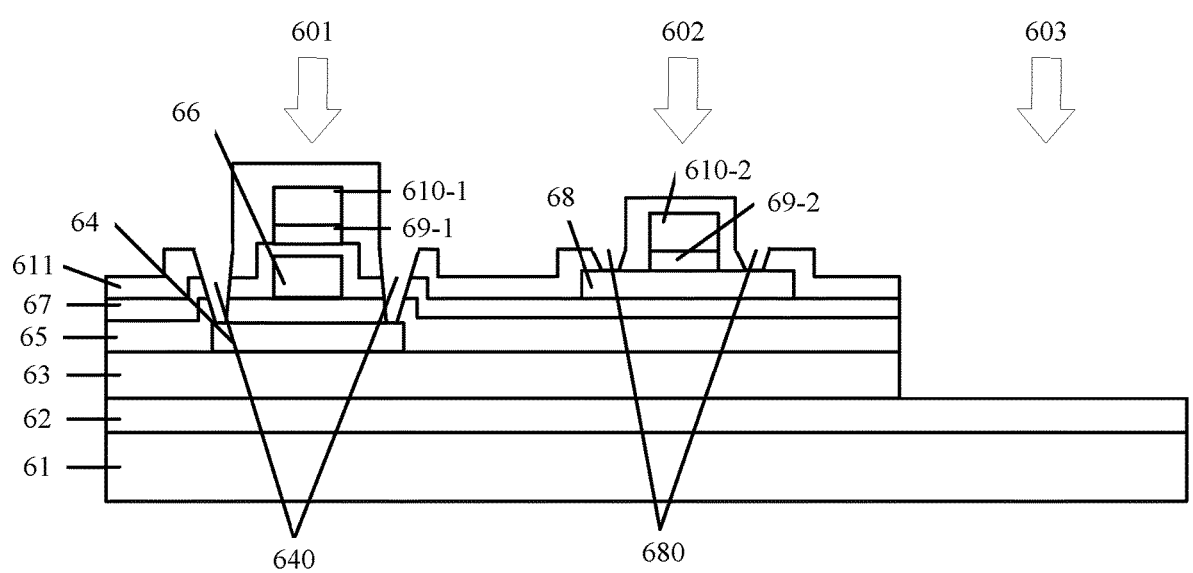

Referring to FIG. 10f, as different from the manufacturing of the rigid display panel, in this process, the second interlayer insulating layer 611, the first interlayer insulating layer 67, the first gate insulating layer 65, and the buffer layer 63 in the third region 603 are patterned by a sixth masking process, that is, these film layers in the third region 603 are removed by etching to expose the PI layer 62.

In step S113B, a second planarization layer is deposited on the exposed surface of the PI layer.

Figure 10G:
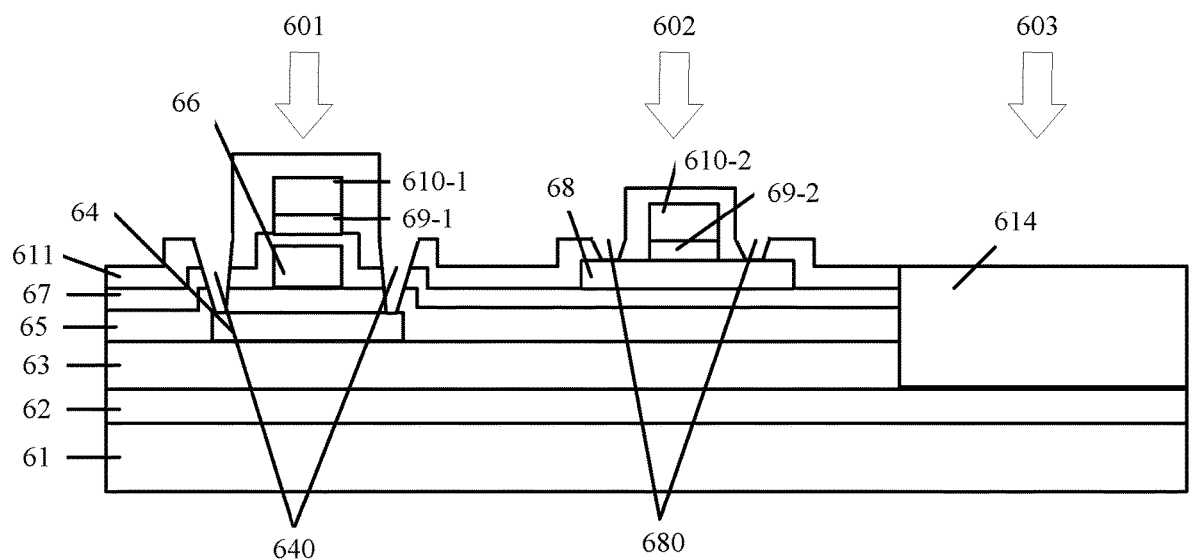

Referring to FIG. 10g, a PI film layer is formed, and a second planarization layer 614 is formed in the third region 603 using a seventh masking process. The second planarization layer 614 is made of a bendable material, which is more flexible than the interlayer insulating layer and the gate insulating layer. In a direction perpendicular to the surface of the substrate 61, a height of the second planarization layer 614 is equal to a height of the second interlayer insulating layer 611.

Figure 7:
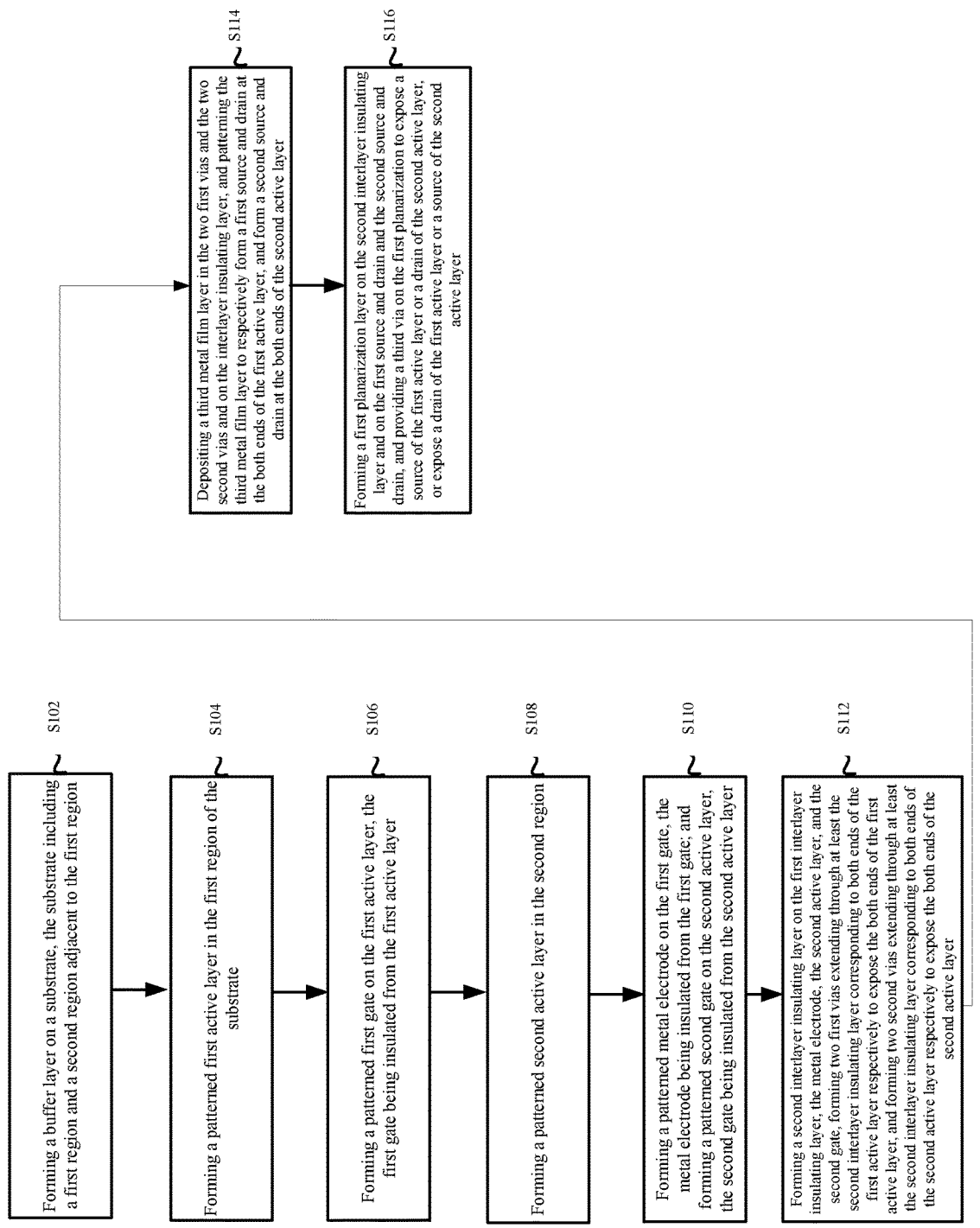
FIG. 7 shows a flowchart of the method for manufacturing an organic electroluminescence display panel according to yet another embodiment of the present disclosure.

Referring to FIG. 7, in an embodiment, the method can also further include the following steps.

In step S114, the third metal film layer is deposited in the two first vias and the two second vias and on the interlayer insulating layer. The third metal film layer is patterned, so that a first source and drain is formed at the both ends of the first active layer, and a second source and drain is formed at the both ends of the second active layer respectively.

Figure 9F:
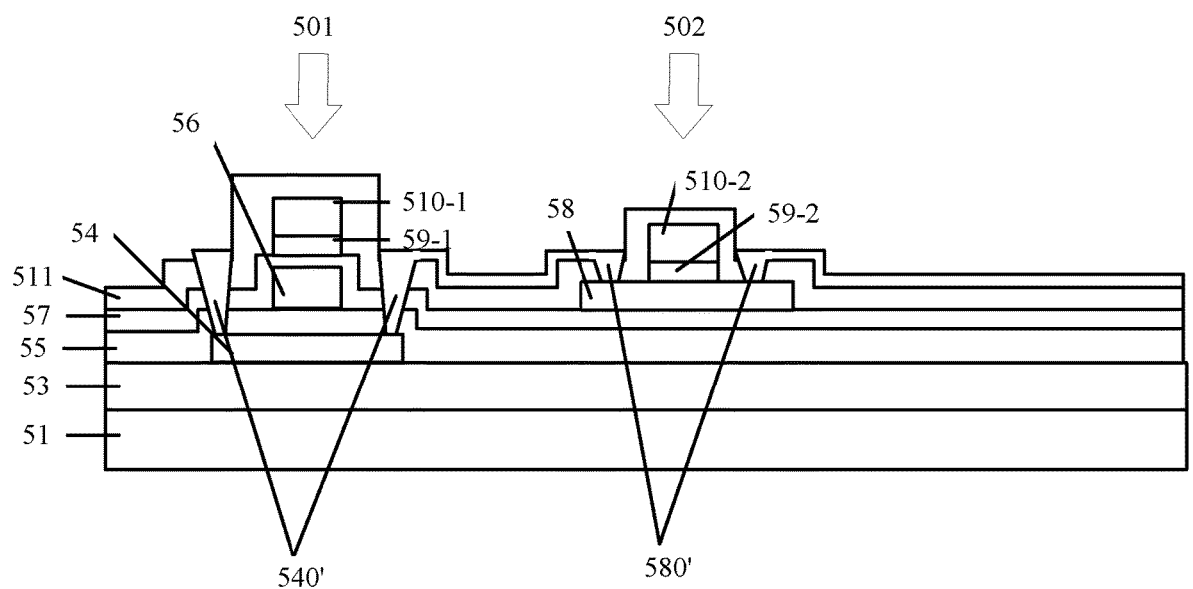

During manufacturing of the rigid display panel, referring to FIG. 9f, the third metal film layer is deposited by the PVD process on the second interlayer insulating layer 511 having the two first vias 540 and the two second vias 580. Then, using a sixth masking process, the first source and drain 540' is formed at the both ends of the first active layer 54 in the first region 501, and the second source and drain 580' is formed at the both ends of the second active layer 58 in the second region 502 respectively, that is, the source and drain of the LTPS-TFT is formed in the first region 501, and the source and drain of the Oxide-TFT is formed in the second region 502.

Figure 10H:
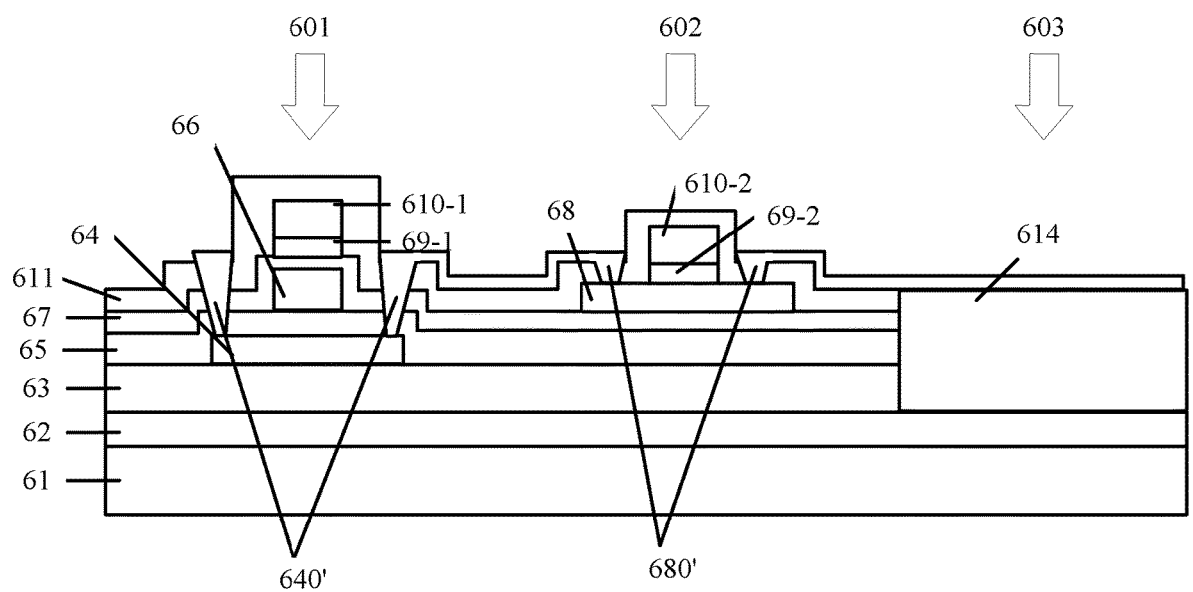

During manufacturing of the flexible display panel, referring to FIG. 10h, the third metal film layer is deposited by the PVD process on the second interlayer insulating layer 611 having the two first vias 540 and the two second vias 580. Then, using the sixth masking process, the first source and drain 640' is formed at the both ends of the first active layer 64 in the first region 601, and the second source and drain 680' is formed at the both ends of the second active layer 68 in the second region 602 respectively, that is, the source and drain of the LTPS-TFT is formed in the first region 601, and the source and drain of the Oxide-TFT is formed in the second region 602.

In step S116, a first planarization layer is formed on the second interlayer insulating layer, the first source and drain, and the second source and drain. The first planarization layer is provided with the third via to expose the source of the first active layer or the drain of the second active layer, or expose the drain of the first active layer or the source of the second active layer.

Figure 9G:
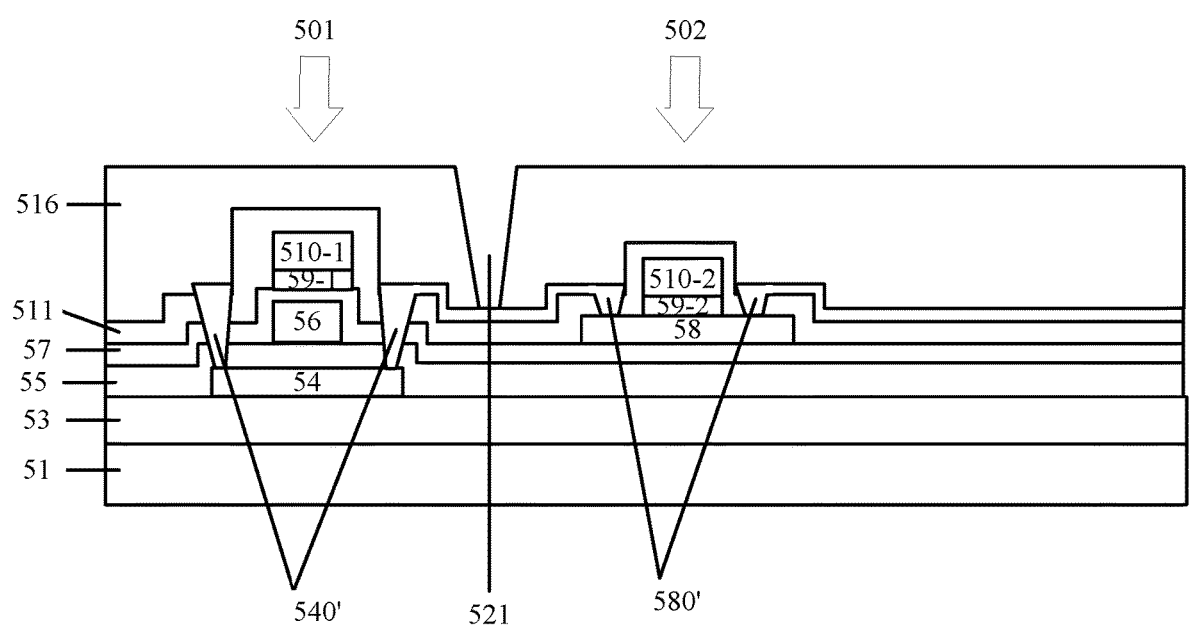

During manufacturing of the rigid display panel, referring to FIG. 9g, the first planarization layer 516 is formed by the PVD process, and the third via 521 is formed in the first planarization layer 516 using a seventh masking process. The third via 521 exposes the source of the first active layer 54 or the drain of the second active layer 58 (where the source of the first active layer 54 is connected to the drain of the second active layer 58), or exposes the drain of the first active layer 54 or the source of the second active layer 58 (where the drain of the first active layer 54 is connected to the source of the second active layer 58).

Figure 10I:
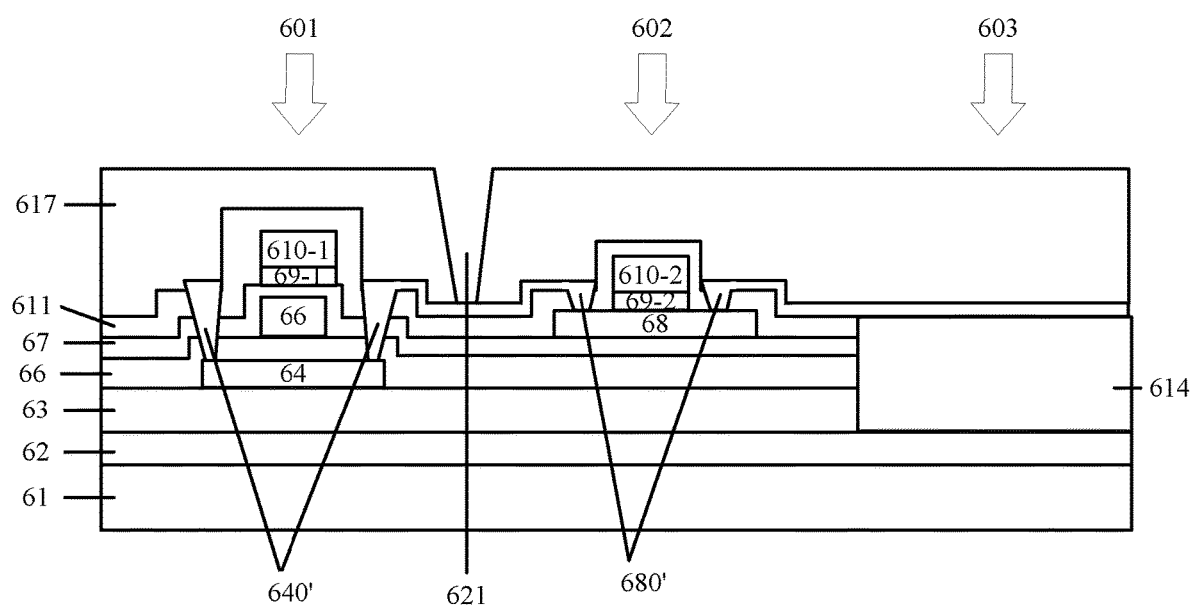

During manufacturing of the flexible display panel, referring to FIG. 10i, the first planarization layer 617 is formed using the PVD process, and the third via 621 is formed in the first planarization layer 617 using a ninth the masking process. The third via 621 exposes the source of the first active layer 64 or the drain of the second active layer 68 (where the source of the first active layer 64 is connected to the drain of the second active layer 68), or exposes the drain of the first active layer 64 or the source of the second active layer 68 (where the drain of the first active layer 64 is connected to the source of the second active layer 68).

Figure 8:
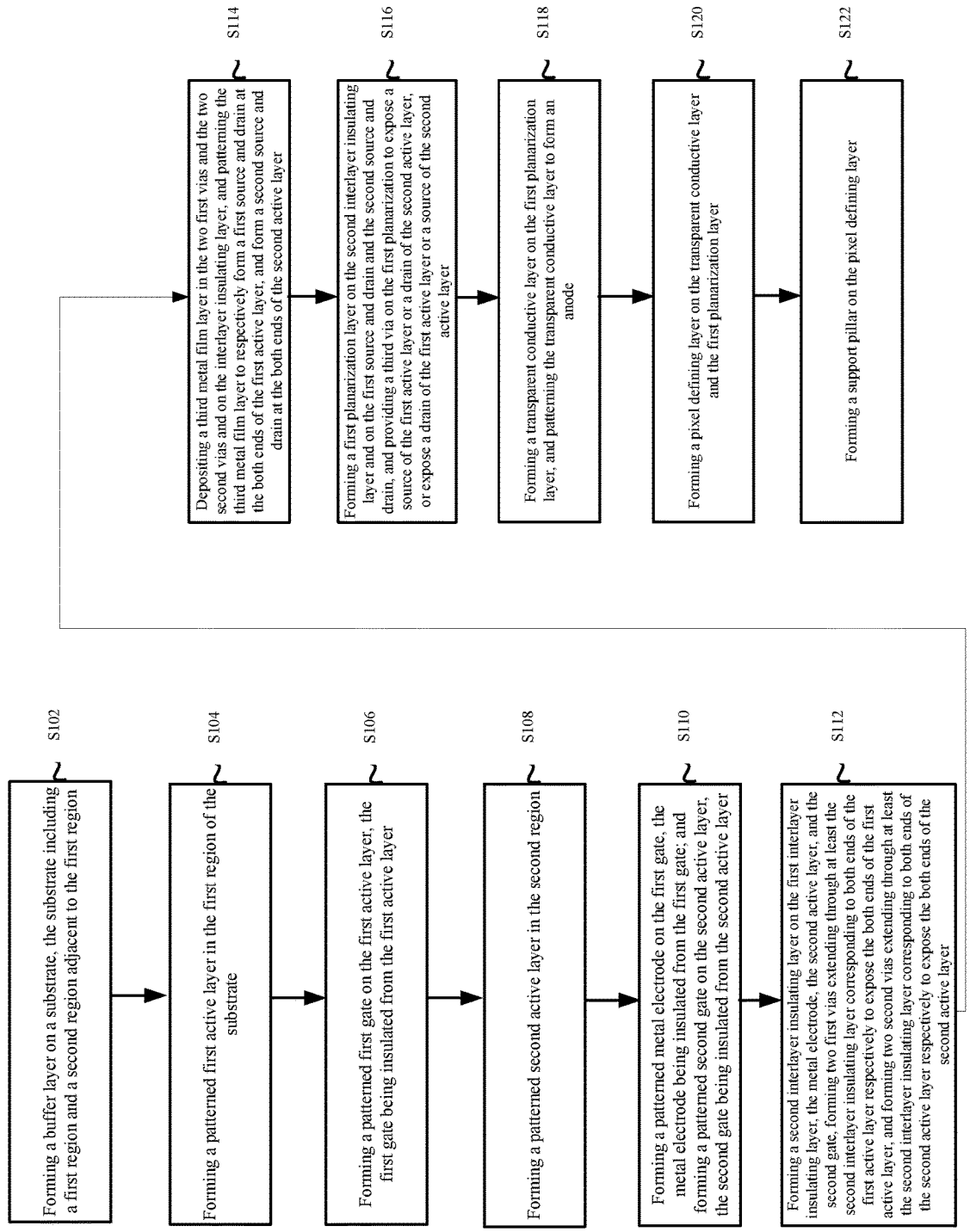
FIG. 8 shows a flowchart of the method for manufacturing an organic electroluminescence display panel according to another embodiment of the present disclosure.

Optionally, referring to FIG. 8, the method further includes the following steps.

In step S118, a transparent conductive layer is formed on the first planarization layer, and the conductive layer is patterned to form an anode.

Figure 9H:
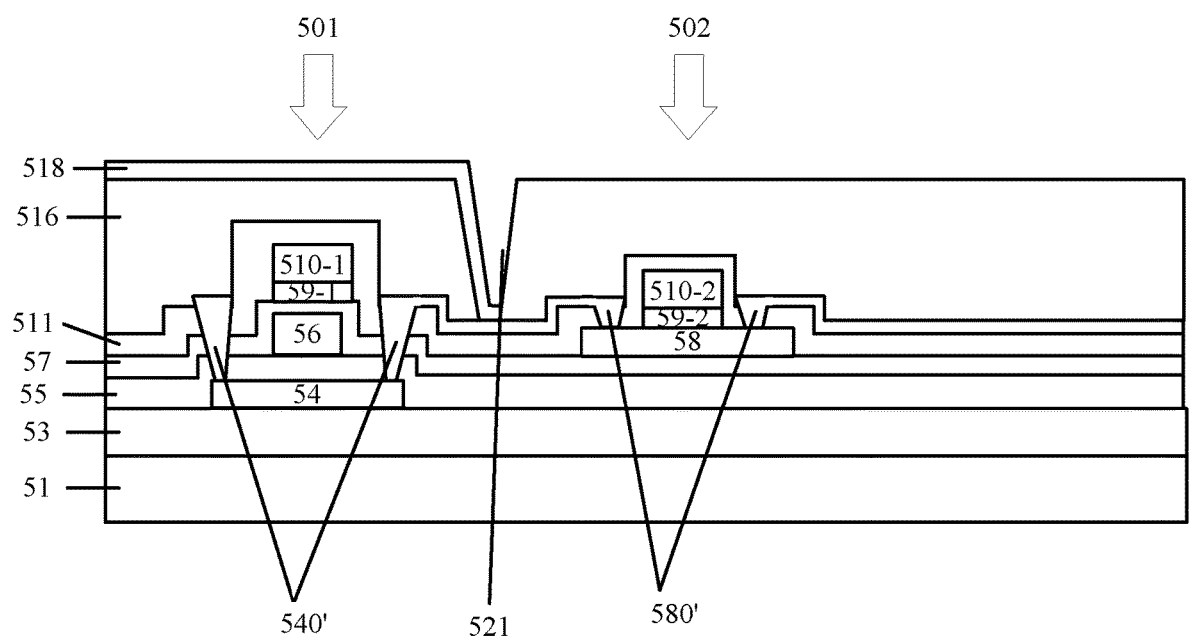

During manufacturing of the rigid display panel, referring to FIG. 9h, the transparent conductive layer is formed on the first planarization layer 516, and the patterned anode 518 is obtained using an eighth masking process.

Figure 10J:
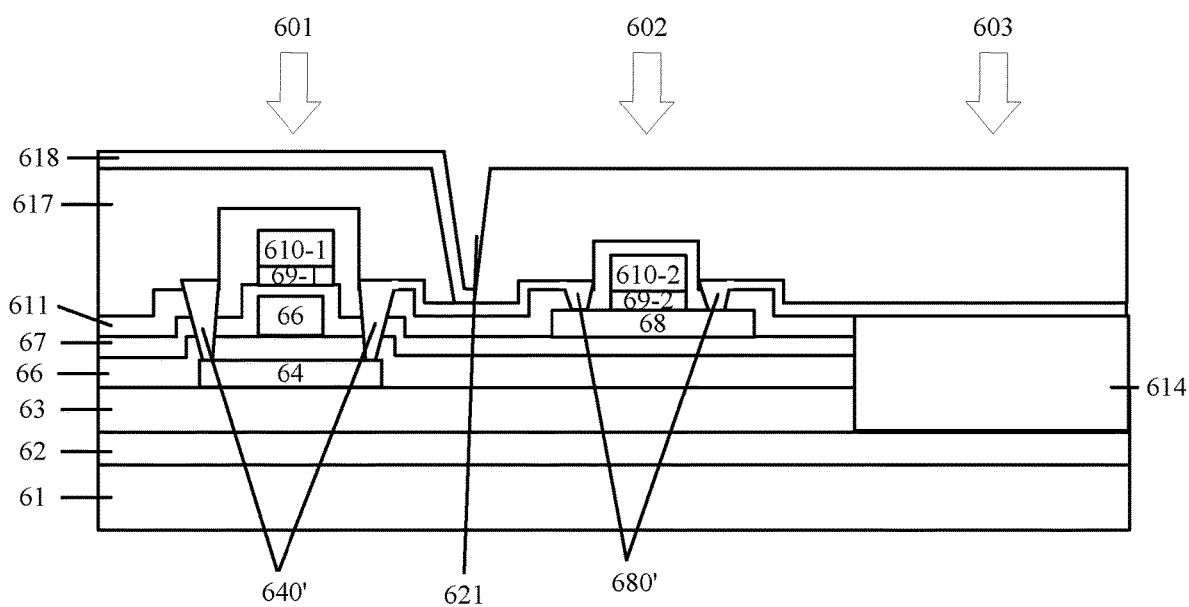

During manufacturing of the flexible display panel, referring to FIG. 10j, the transparent conductive layer is formed on the first planarization layer 617, and the patterned anode 618 is obtained using a tenth masking process.

In step S120, a pixel defining layer is formed on the transparent conductive layer and the first planarization layer.

Figure 9I:
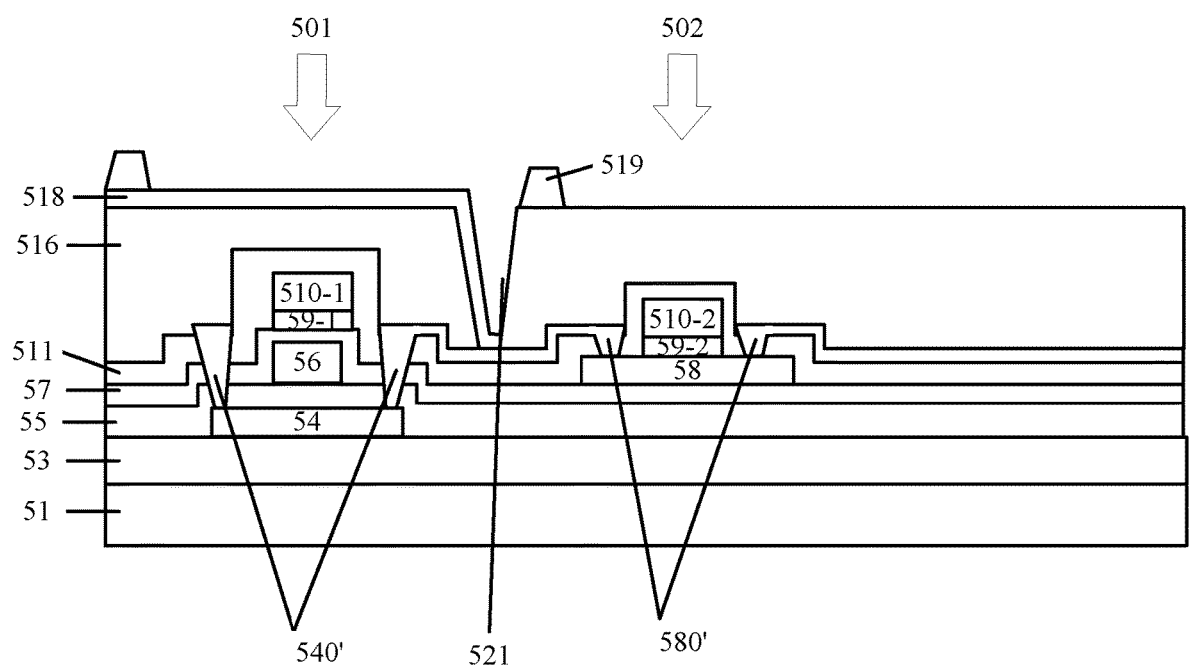

During manufacturing of the rigid display panel, referring to FIG. 9i, the formed PI layer is patterned using the ninth masking process to obtain the pixel defining layer 519.

Figure 10K:
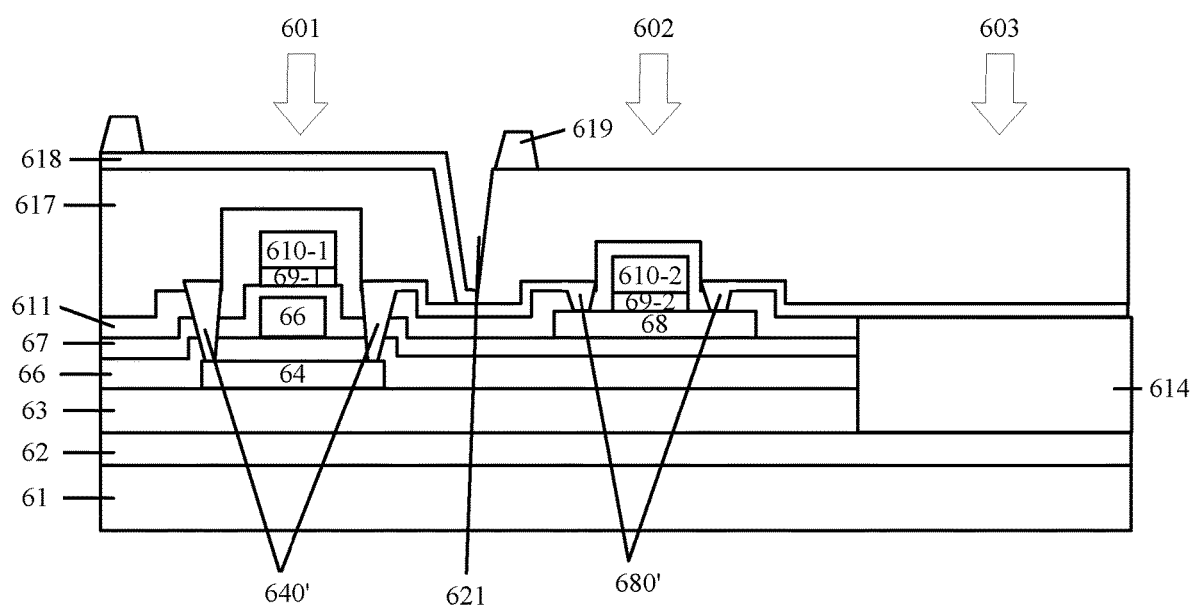

During manufacturing of the flexible display panel, referring to FIG. 10k, the formed PI layer is patterned using an eleventh masking process to obtain the pixel defining layer 619.

In step S122, a support pillar is formed on the pixel defining layer.

Figure 9J:
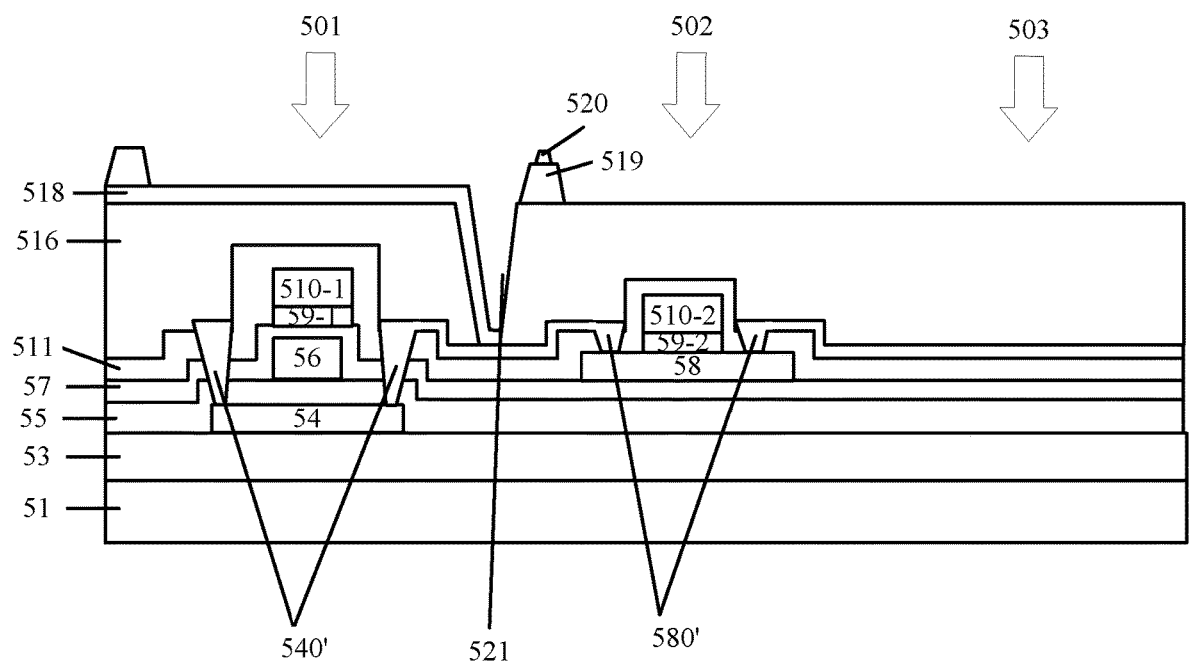

During manufacturing of the rigid display panel, referring to FIG. 9j, the formed PI layer is patterned using the tenth masking process to obtain the support pillar 520.

Figure 10L:
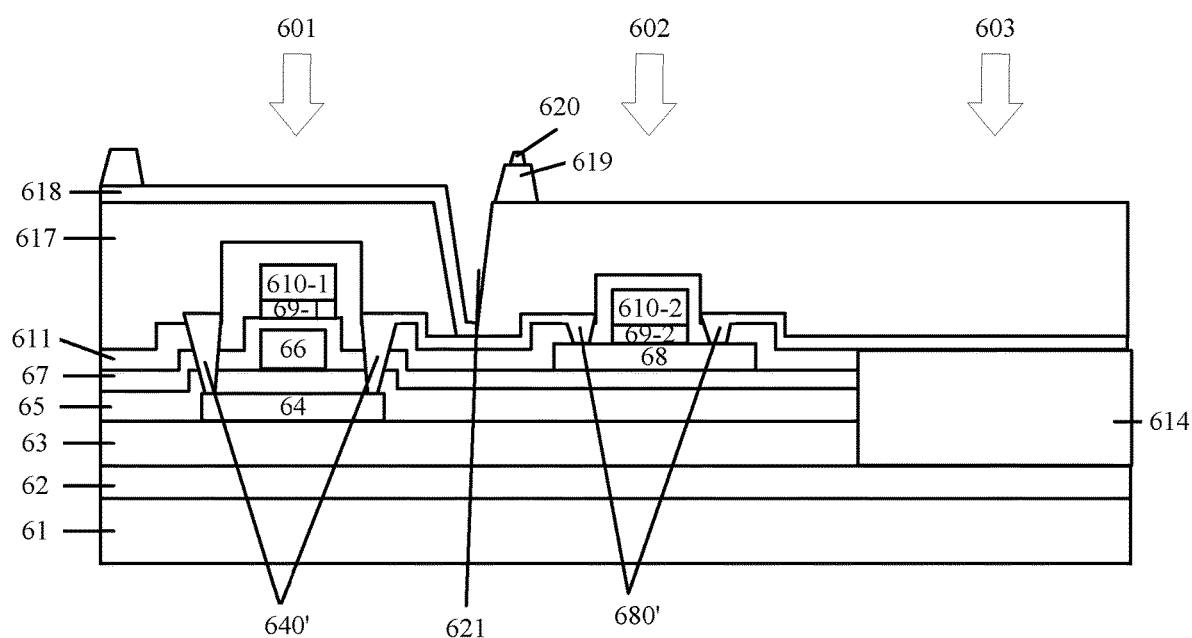

During manufacturing of the flexible display panel, referring to FIG. 10l, the formed PI layer is patterned using a twelfth masking process to obtain the support pillar 620.

The difference between the manufacturing process of the rigid display panel and the manufacturing process of the flexible display panel is that, in the manufacturing process of the rigid display panel, it is not required to remove, by etching, the film layers from the second interlayer insulating layer 511 to the buffer layer 53 corresponding to the third region 503 of the buffer layer 53. As such, the retained film layers are not conducive to bending operations, so that the organic electroluminescence display panel manufactured by the method is a rigid display. While in steps 113A and 113B of the method for manufacturing the flexible display panel, it is required to remove, by etching, the film layers from the second interlayer insulating layer 611 to the buffer layer 63 corresponding to the third region 603 of the buffer layer 63 to expose the PI layer, and then replace the film layers with the second planarization layer 614 made of a more flexible material. As such, the bending operations can be performed on the manufactured display panel in the third region 603, so that the organic electroluminescence display panel manufactured by the method is a flexible display.

It should be noted that, besides the above-mentioned steps, the method can also include other steps, such as, a step of forming various insulating layers, a step of forming a bonding layer, and the like, which will not be limited hereto.

Therefore, the manufacture of the organic electroluminescence display panel is completed. Since the active layers of the LTPS-TFT and Oxide-TFT are located below the gates due to the top gate configuration, the vias for the sources and drains can be subsequently formed using the same one masking process. As such, the rigid display panel and the flexible display panel respectively require the masking process for only ten times and twelve times to manufacture the desired organic electroluminescence display panel. Compared to the conventional masking process that requires the masking process for eleven times and the masking process for thirteen times, the times of masking can be reduced, and the processes can be simplified.

Figure 11:
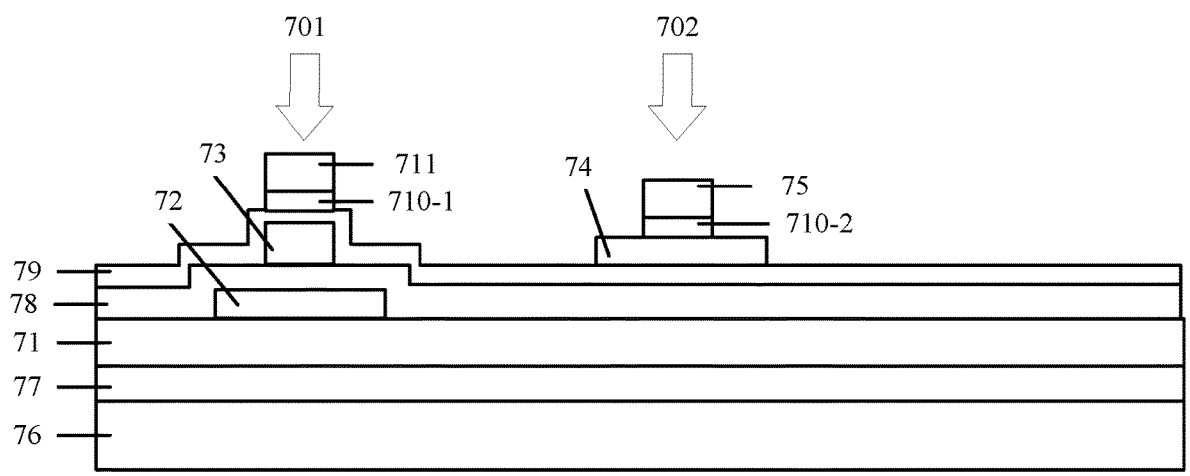
FIG. 11 is a schematic diagram of an organic electroluminescence display panel according to an embodiment of the present disclosure.

The embodiments of the present disclosure further provide an organic electroluminescence display panel, as shown in FIG. 11. The organic electroluminescence display panel includes the following structures.

A substrate 76 includes a first region 701 and a second region 702.

A PI layer 77 is located on the substrate 76.

A buffer layer 71 is located on the PI layer 77.

A patterned first active layer 72 is located on the buffer layer 71 corresponding to the first region 701. In an embodiment, the first active layer 72 is made of low temperature polysilicon, also known as P—Si.

A first gate insulating layer 78 is located on the buffer layer 71 and the first active layer 72.

A first gate 73 is located on the first gate insulating layer 78 corresponding to the first region 701, the first gate 73 corresponds to the first active layer 72.

A first interlayer insulating layer 79 is located on the first gate insulating layer 78 and the first gate 73.

A patterned second active layer 74 is located on the buffer layer 71 corresponding to the second region 702. In an embodiment, the second active layer 74 is made of a metal oxide, which can specifically be an IGZO.

A second gate insulating layer 710-1 is located on the first interlayer insulating layer 79 corresponding to the first gate 73.

A patterned metal electrode 711 is located on the second gate insulating layer 710-1.

A third gate insulating layer 710-2 is located on the second active layer 74.

A patterned second gate 75 is located on the third gate insulating layer 710-2.

The second gate insulating layer 710-1 and the metal electrode 711 in the first region 701 have the same pattern. The third gate insulating layer 710-2 and the second gate 75 in the second region 702 have the same pattern.

Figure 12:
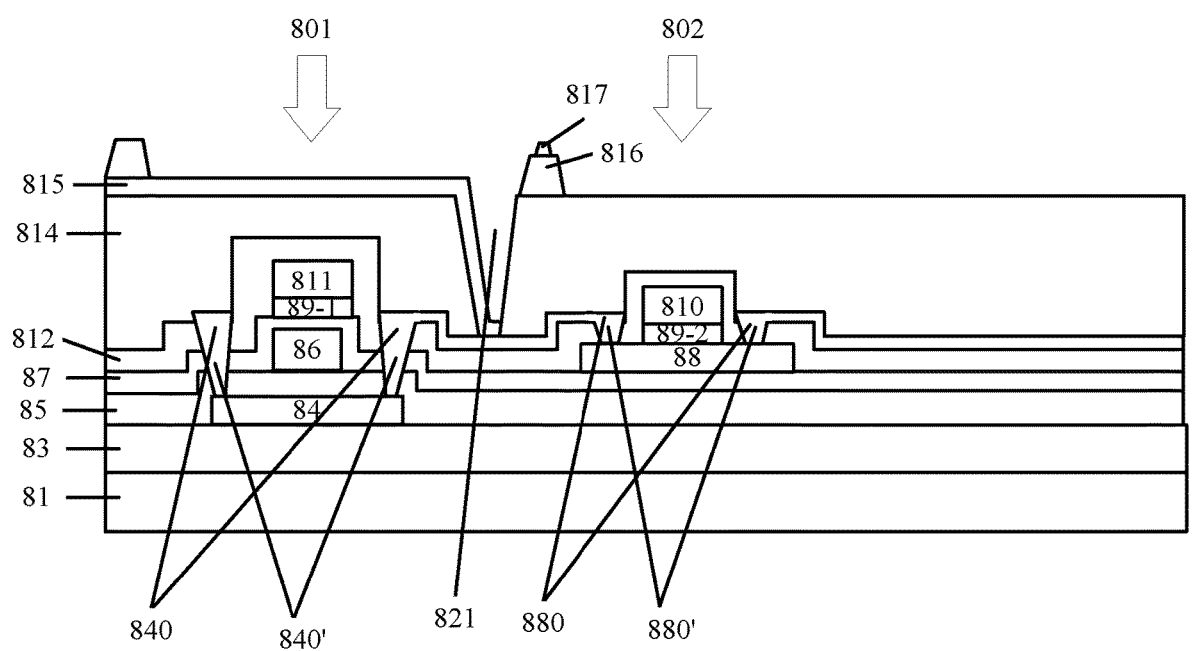
FIG. 12 is a schematic diagram of a rigid organic electroluminescence display panel according to an embodiment of the present disclosure.

FIG. 12 shows a diagram of the rigid organic electroluminescence display panel according to an embodiment of the present disclosure. The rigid organic electroluminescence display panel can include substantially the following structures:

A substrate 81 includes a first region 801 and a second region 802. The substrate 81 can be a glass substrate in one embodiment.

A buffer layer 83 is located on a surface of the substrate 81.

A first active layer 84 is located on the buffer layer 83, and corresponds to the first region 801. The first active layer 84 is a P—Si active layer in an embodiment.

A first gate insulating layer 85 is located on the first active layer 84.

A first gate 86 is located on the first gate insulating layer 85 corresponding to the first region 801.

A first interlayer insulating layer 87 is located on the first gate 86. In an embodiment, the first interlayer insulating layer 87 is also located on the first gate insulating layer 85.

A second active layer 88 is located on the first interlayer insulating layer 87, and corresponds to the second region 802. The second active layer 88 can be an IGZO active layer.

A second gate insulating layer 89-1 is located on the first gate 86, specifically is located on the first interlayer insulating layer 87 corresponding to the first gate 86.

A metal electrode 811 is located on the second gate insulating layer 89-1.

A third gate insulating layer 89-2 is located on the second active layer 88.

A second gate 810 is located on the third gate insulating layer 89-2.

In an embodiment, the metal electrode 811 and the second gate insulating layer 89-1 have the same pattern, and the second gate 810 and the third gate insulating layer 89-2 have the same pattern.

A second interlayer insulating layer 812 is located on the metal electrode 811 and the second gate 810. In an embodiment, the second interlayer insulating layer 812 is also located on the first interlayer insulating layer 87.

Two first vias 840 are located in positions corresponding to both ends of the first active layer 84, penetrate at least the first gate insulating layer 85, and respectively expose the both ends of the first active layer 84 to form a source and drain. Two second vias 880 are located in positions corresponding to both ends of the second active layer 88, and respectively expose the both ends of the second active layer 88 to form a source and drain.

A first source and drain 840' is located at the both ends of the first active layer 84. A second source and drain 880' is located at the both ends of the second active layer 88.

A first planarization layer 814 is located on the second interlayer insulating layer 812, the first source and drain 840', and the second source and drain 880'. The first planarization layer 814 is provided with a third via 821. The third via 821 exposes the source of the first active layer 84 or the drain of the second active layer 88, or expose the drain of the first active layer 84 or the source of the second active layer 88.

An anode 815 is located on the first planarization layer 814. The anode 815 is connected to the source and drain in the third via 821 of the first planarization layer 814.

A patterned pixel defining layer 816 is located on the anode 815.

A support pillar 817 is located on the pixel defining layer 816.

The active layer of the LTPS-TFT in the first region and the active layer of the Oxide-TFT in the second region are located below the gates due to the top gate configuration adopted for the rigid display panel. As such, the vias for manufacturing the sources and drains can be formed using the same masking process, and the desired rigid organic electroluminescence display panel can be manufactured using the masking process for only ten times. Compared to the conventional masking process for eleven times, the times of masking can be reduced, and the processes can be simplified.

Figure 13:
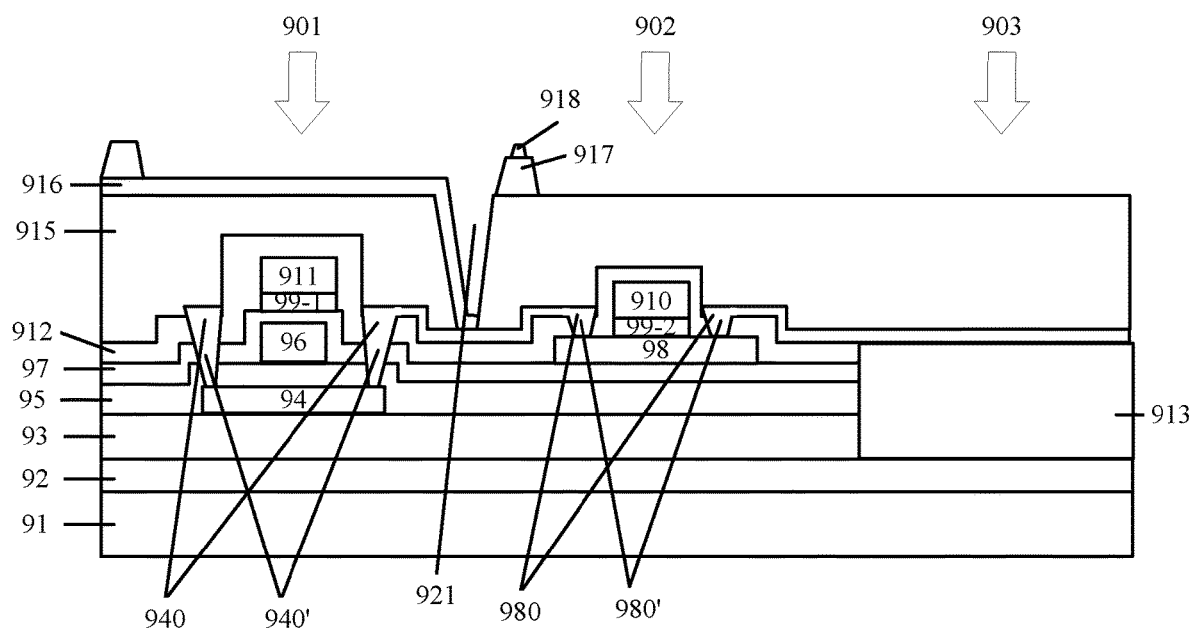
FIG. 13 is a schematic diagram of a flexible organic electroluminescence display panel according to an embodiment of the present disclosure.

FIG. 13 shows a diagram of the flexible organic electroluminescence display panel according to an embodiment of the present disclosure. The flexible organic electroluminescence display panel substantially includes the following structures.

A substrate 91 includes a first region 901, a second region 902, and a third region 903. The substrate 91 is a glass substrate in one embodiment.

A PI layer 92 is located on the glass substrate 91.

A buffer layer 93 is located on the PI layer 92. Specifically, it is located on a surface of the PI layer away from the glass substrate 91.

A first active layer 94 is located on the buffer layer 93, and corresponds to the first region 901. The first active layer 94 is a P—Si active layer in one embodiment.

A first gate insulating layer 95 is located on the first active layer 94.

A first gate 96 is located on the first gate insulating layer 95 corresponding to the first region 901.

A first interlayer insulating layer 97 is located on the first gate 96. In an embodiment, the first interlayer insulating layer 97 is also located on the first gate insulating layer 95.

A second active layer 98 is located on the first interlayer insulating layer 97, and corresponds to the second region 902. The second active layer 98 can be an IGZO active layer.

A second gate insulating layer 99-1 is located on the first gate 96.

Specifically, the second gate insulating layer 99-1 is located on the first interlayer insulating layer 97 corresponding to the first gate 96.

A metal electrode 911 is located on the second gate insulating layer 99-1.

A third gate insulating layer 99-2 is located on the second active layer 98.

A second gate 910 is located on the third gate insulating layer 99-2.

In an embodiment, the metal electrode 911 and the second gate insulating layer 99-1 have the same pattern, and the second gate 910 and the third gate insulating layer 99-2 have the same pattern.

A second interlayer insulating layer 912 is located on the metal electrode 911 and second gate 910.

Two first vias 940 are located in positions corresponding to both ends of the first active layer 94, penetrate at least the first gate insulating layer 95, and respectively expose the both ends of the first active layer 94 to form a source and drain.

Two second vias 980 are located in positions corresponding to both ends of the second active layer 98, and respectively expose the both ends of the two active layer 98 to form a source and drain.

A first source and drain 940' is located at the both ends of the first active layer 94. A second source and drain 980' is located at the both ends of the second active layer 98.

A first planarization layer 915 is located on the second interlayer insulating layer 912, the first source and drain 940', and the second source and drain 980'. The first planarization layer 915 is provided with a third via 921. The third via 921 exposes the source of the first active layer 94 or the drain of the second active layer 98, or expose the drain of the first active layer 94 or the source of the second active layer 98.

An anode 916 is located on the planarization layer 915. The anode 916 is connected to the source and drain in the third via 921 of the planarization layer 915.

A pixel defining layer 917 is patterned and located on the anode 916. A support pillar 918 is located on the pixel defining layer 917.

Furthermore, as different from the above-mentioned rigid organic electroluminescence display panel, the substrate 91 further includes the third region 903, which is adjacent to the second region 902. The PI layer 92 is also provided between the substrate 91 and the buffer layer 93. The second interlayer insulating layer 912, the first interlayer insulating layer 97, the first gate insulating layer 95, and the buffer layer 93 in the third region 903 are removed to expose the PI layer 92. Then, a second planarization layer 913 is formed on the removed portion.

The active layer of the LTPS-TFT in the first region and the active layer of the Oxide-TFT in the second region are located below the gates due to the top gate configuration adopted for the flexible display panel. As such, the vias for manufacturing the sources and drains can be formed using the same masking process, and the desired rigid organic electroluminescence display panel can be manufactured using the masking process for only twelve times. Compared to the masking process for thirteen times in the prior art, the times of masking can be reduced, and the processes can be simplified. Moreover, the second planarization layer 913 is made of a bendable material, which is more flexible than the interlayer insulating layer and the gate insulating layer, thereby implementing the flexible display panel.

Figure 14:
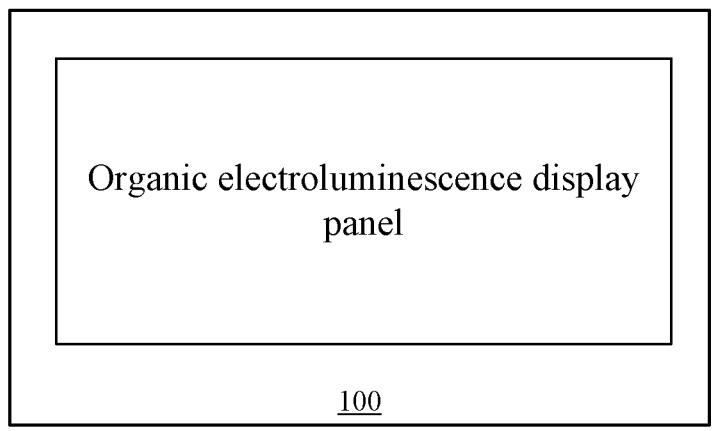
FIG. 14 is a schematic diagram of a display apparatus according to an embodiment of the present disclosure.

As shown in FIG. 14, a display apparatus 100 is further provided, which includes the above-mentioned organic electroluminescence display panel. Furthermore, the display apparatus can a mobile phone, a tablet, a television, a display, a notebook, a digital photo frame, a navigator, an intelligent wearable device, or any product or component having a display function. The other essential components of the display apparatus should be understood by those of ordinary skill in the art, and will not be repeated herein, nor should it be used as a limitation on the present disclosure.

All technical features in the embodiments can be employed in arbitrary combinations. For the purpose of simplifying the description, not all arbitrary combinations of the technical features in the embodiments illustrated above are described herein. However, as long as such combinations of the technical features are not contradictory, they should be considered as falling within the scope of the disclosure in the specification.

Variations and improvements will become apparent to those skilled in the art to which the present disclosure pertains without departing from its scope, and these variations and improvements fall within the protection scope of the present disclosure. Therefore, the protection scope of the present disclosure is defined by the appended claims.

What is claimed is:

1. An organic electroluminescence display panel, comprising:
    a substrate comprising a first region and a second region adjacent to the first region;
    a buffer layer positioned on the substrate;
    a patterned first active layer positioned on the buffer layer and corresponding to the first region;
    two first vias located in positions corresponding to both ends of the first active layer, the two first vias being configured to expose the both ends of the first active layer respectively;
    a patterned first gate positioned on the first active layer and insulated from the first active layer;
    a patterned second active layer positioned on the buffer layer and corresponding to the second region;
    two second vias located in positions corresponding to both ends of the second active layer, the two second vias being configured to expose the both ends of the second active layer respectively;
    a patterned metal electrode positioned on the first gate and insulated from the first gate; and
    a patterned second gate positioned on the second active layer and insulated from the second active layer;
    a first interlayer insulating layer located on the first gate;
    a second interlayer insulating layer located on the metal electrode and the second gate;
    a first source and drain located at the both ends of the first active layer;
    a second source and drain located at the both ends of the second active layer; and
    a first planarization layer located on the second interlayer insulating layer, the first planarization layer being provided with a third via, the third via exposing a source of the first active layer or a drain of the second active layer, or exposing a drain of the first active layer or a source of the second active layer.

2. The organic electroluminescence display panel of claim 1, further comprising:
- a first gate insulating layer located between the first active layer and the first gate;
- a second gate insulating layer located on the first interlayer insulating layer corresponding to the first region, the second gate insulating layer corresponding to the first gate; and
- a third gate insulating layer located between the second active layer and the second gate.

3. The organic electroluminescence display panel of claim 1, further comprising:
- a transparent conductive layer located on the first planarization layer to form an anode;
- a pixel defining layer located on the transparent conductive layer and the first planarization layer; and
- a support pillar located on the pixel defining layer.

4. The organic electroluminescence display panel of claim 1, wherein the substrate further comprises a third region adjacent to the second region, and the display panel further comprises:
- a polyimide (PI) layer located between the substrate and the buffer layer; and
- a second planarization layer deposited on a surface of the PI layer corresponding to the third region and extending through the second interlayer insulating layer to the buffer layer.

5. The organic electroluminescence display panel of claim 1, wherein the first active layer is made of low temperature polysilicon.

6. The organic electroluminescence display panel of claim 1, wherein the second active layer is made of metal oxide.

7. A display apparatus, comprising the organic electroluminescence display panel of claim 1.

8. The organic electroluminescence display panel of claim 1, wherein the second active layer comprises an indium gallium zinc oxide material.

9. A method for manufacturing an organic electroluminescence display panel, comprising:
- forming a buffer layer on a substrate, the substrate comprising a first region and a second region adjacent to each other;
- forming a patterned first active layer on the buffer layer corresponding to the first region;
- forming a patterned first gate on the first active layer, the first gate being insulated from the first active layer;
- forming a patterned second active layer on the buffer layer corresponding to the second region;
- forming a patterned metal electrode on the first gate, the metal electrode being insulated from the first gate; and
- forming a patterned second gate on the second active layer, the second gate being insulated from the second active layer;
- forming a second interlayer insulating layer on the first interlayer insulating layer, the metal electrode, and the second gate;
- forming two first vias penetrating at least the first gate insulating layer corresponding to both ends of the first active layer, and exposing the both ends of the first active layer, respectively; and
- forming two second vias penetrating at least the second interlayer insulating layer corresponding to both ends of the second active layer, and exposing the both ends of the second active layer, respectively;
- wherein the two first vias and the two second vias are formed simultaneously in the first region and the second region respectively.

10. The method of claim 9, wherein the forming the patterned first gate on the first active layer comprises:
- forming a first gate insulating layer on the first active layer;
- forming a first metal film layer on the first gate insulating layer; and
- patterning the first metal film layer to obtain the first gate.

11. The method of claim 10, wherein the forming the patterned second active layer in the second region comprises:
- forming a first interlayer insulating layer on the first gate insulating layer and the first gate; and
- forming a metal oxide layer on the first interlayer insulating layer corresponding to the second region, and patterning the metal oxide layer to obtain the second active layer.

12. The method of claim 11, wherein the forming the patterned metal electrode on the first gate, and forming the patterned second gate on the second active layer comprises:
- forming a silicon oxide film layer on the first interlayer insulating layer;
- forming a second metal film layer on the silicon oxide film layer; and
- patterning the second metal film layer and the silicon oxide film layer, respectively to obtain a second gate insulating layer located in the first region and the metal electrode located on the second gate insulating layer, a third gate insulating layer located in the second region, and the second gate located on the third gate insulating layer.

13. The method of claim 12, further comprising:
- depositing a third metal film layer in the two first vias and the two second vias and on the second interlayer insulating layer, and patterning the third metal film layer, forming a first source and drain at the both ends of the first active layer, and forming a second source and drain at the both ends of the second active layer; and
- forming a first planarization layer on the second interlayer insulating layer on the first source and drain and the second source and drain, and forming a third via on the first planarization layer to expose a source of the first active layer or a drain of the second active layer, or expose a drain of the first active layer or a source of the second active layer.

14. The method of claim 13, further comprising:
- forming a transparent conductive layer on the first planarization layer, and patterning the conductive layer to form an anode;
- forming a pixel defining layer on the transparent conductive layer and the first planarization layer; and
- forming a support pillar on the pixel defining layer.

15. The method of claim 12, wherein the substrate further comprises a third region adjacent to the second region, and prior to the forming a buffer layer on a substrate, the method further comprises:
- forming a polyimide (PI) layer on the substrate;
- wherein after the forming the second interlayer insulating layer on the first interlayer insulating layer, the metal electrode, and the second gate, forming two first vias in the second interlayer insulating layer in positions corresponding to both ends of the first active layer, and forming two vias in the second interlayer insulating layer in positions corresponding to both ends of the second active layer, and the two first vias and the two second vias are formed simultaneously in the first region and the second region respectively, the method further comprises:

etching the film layers from the second interlayer insulating layer to the buffer layer corresponding to the third region to expose the PI layer; and depositing a second planarization layer on an exposed surface of the PI layer, the second planarization layer penetrating the second interlayer insulating layer to the buffer layer.

16. The method of claim 15, wherein the second planarization layer is made of a flexible material.

17. The method of claim 9, wherein the first active layer is made of low temperature polysilicon.

18. The method of claim 9, wherein the second active layer is made of metal oxide.

19. The method of claim 15, wherein the first region is a region configured to manufacture a LTPS-TFT, the second region is a region configured to manufacture an Oxide-TFT, and the third region is a region configured to manufacture a bendable region.

\* \* \* \* \*